(12) United States Patent
Ikenaga et al.

(10) Patent No.: US 12,109,778 B2
(45) Date of Patent: Oct. 8, 2024

(54) DEPOSITION MASK PACKAGE AND DEPOSITION MASK PACKAGING METHOD

(71) Applicant: Dai Nippon Printing Co., Ltd., Tokyo (JP)

(72) Inventors: Chikao Ikenaga, Tokyo (JP); Takumi Oike, Tokyo (JP); Tsukasa Mukaida, Tokyo (JP); Takeru Watanabe, Tokyo (JP)

(73) Assignee: Dai Nippon Printing Co., Ltd., Tokyo (JP)

( * ) Notice: Subject to any disclaimer, the term of this patent is extended or adjusted under 35 U.S.C. 154(b) by 512 days.

(21) Appl. No.: 17/444,398

(22) Filed: Aug. 4, 2021

(65) Prior Publication Data
US 2021/0362474 A1     Nov. 25, 2021

Related U.S. Application Data

(60) Division of application No. 16/352,117, filed on Mar. 13, 2019, now Pat. No. 11,148,397, which is a
(Continued)

(30) Foreign Application Priority Data

Sep. 29, 2016  (JP) .................................. 2016-191734
Dec. 7, 2016   (JP) .................................. 2016-237883

(51) Int. Cl.
*B65B 5/04*     (2006.01)
*B32B 15/01*    (2006.01)
(Continued)

(52) U.S. Cl.
CPC ............ *B32B 15/18* (2013.01); *B32B 15/012* (2013.01); *B65B 5/045* (2013.01); *B65B 7/26* (2013.01);
(Continued)

(58) Field of Classification Search
CPC ... B32B 15/012; B32B 15/18; B32B 2553/02; B65B 23/20; B65B 23/00; B65B 25/002;
(Continued)

(56) References Cited

U.S. PATENT DOCUMENTS 4,267,684 A * 5/1981 Ambrose ................ B65B 23/00
                                                    53/472
5,967,327 A * 10/1999 Jones ................... B65D 81/075
                                                   206/466
(Continued)

FOREIGN PATENT DOCUMENTS

CN      101065827 A     10/2007
CN      202924103 U     5/2013
(Continued)

OTHER PUBLICATIONS

European Office Action (Application No. 17 855 714.6) dated Mar. 2, 2022.
(Continued)

*Primary Examiner* — Joshua G Kotis
(74) *Attorney, Agent, or Firm* — BURR PATENT LAW, PLLC

(57) ABSTRACT

A deposition mask package according to the present embodiment includes a receiving portion, a lid portion that faces the receiving portion, a deposition mask that is arranged between the receiving portion and the lid portion and has an effective region in which a plurality of through-holes is formed. The receiving portion has a first opposing surface facing the lid portion and a concave portion provided on the first opposing surface. The concave portion is covered by a first flexible film. The effective region of the deposition mask is arranged on the concave portion with the first flexible film interposed therebetween.

8 Claims, 21 Drawing Sheets

Related U.S. Application Data continuation of application No. PCT/JP2017/032938, filed on Sep. 12, 2017.

(51) Int. Cl.

| | |
|---|---|
| *B32B 15/18* | (2006.01) |
| *B65B 7/26* | (2006.01) |
| *B65B 23/00* | (2006.01) |
| *B65D 43/16* | (2006.01) |
| *B65D 77/04* | (2006.01) |
| *B65D 79/00* | (2006.01) |
| *B65D 81/05* | (2006.01) |
| *B32B 37/24* | (2006.01) |
| *B65D 71/02* | (2006.01) |
| *H01L 25/00* | (2006.01) |

(52) U.S. Cl.
CPC .............. *B65B 23/00* (2013.01); *B65D 43/16* (2013.01); *B65D 77/04* (2013.01); *B65D 79/00* (2013.01); *B65D 81/05* (2013.01); *B32B 2037/246* (2013.01); *B32B 2553/00* (2013.01); *B32B 2553/02* (2013.01); *B65B 2220/16* (2013.01); *B65D 71/02* (2013.01); *H01L 25/00* (2013.01)

(58) Field of Classification Search
CPC .......... B65B 5/045; B65B 5/067; B65B 7/26; B65B 2220/16; B65B 2220/18; B65D 77/04

See application file for complete search history.

(56) References Cited

U.S. PATENT DOCUMENTS

| | | | | |
|---|---|---|---|---|
| 6,302,272 | B1* | 10/2001 | Hata | B65B 61/22 206/451 |
| 6,675,973 | B1* | 1/2004 | McDonald | B65D 5/5028 206/583 |
| 9,103,849 | B2* | 8/2015 | Branch | G01P 15/04 |
| 9,321,574 | B2* | 4/2016 | Garner | B65B 61/22 |
| 9,329,094 | B2* | 5/2016 | Noguchi | G01L 5/0052 |
| 2004/0195142 | A1* | 10/2004 | Hayashi | B65D 57/006 206/545 |
| 2006/0110904 | A1 | 5/2006 | Conrad | |
| 2006/0130580 | A1 | 6/2006 | Ikegami | |
| 2010/0230793 | A1* | 9/2010 | Kudose | H01L 24/86 257/E23.18 |
| 2010/0282824 | A1* | 11/2010 | Kannankeril | B31D 5/0073 493/267 |
| 2014/0121324 | A1 | 5/2014 | Boutrid et al. | |
| 2014/0166612 | A1 | 6/2014 | Petisce et al. | |
| 2015/0251205 | A1 | 9/2015 | Hirobe et al. | |
| 2016/0101900 | A1 | 4/2016 | Baek | |
| 2018/0141700 | A1* | 5/2018 | Ridgeway | B65B 49/08 |
| 2019/0237349 | A1 | 8/2019 | Ikenaga et al. | |

FOREIGN PATENT DOCUMENTS

| | | |
|---|---|---|
| CN | 204078438 U | 1/2015 |
| CN | 104838037 A | 8/2015 |
| CN | 204713760 U | 10/2015 |
| CN | 207536458 U | 6/2018 |
| JP | H11-278430 A1 | 10/1999 |
| JP | 2001-234385 A1 | 8/2001 |
| JP | 2005-206377 A1 | 8/2005 |
| JP | 2009-078836 A1 | 4/2009 |
| JP | 2009-078837 A1 | 4/2009 |
| JP | 2012-136246 A1 | 7/2012 |
| JP | 5382259 B1 | 1/2014 |
| JP | 2015-168847 A1 | 9/2015 |
| KR | 10-2016-0042319 A | 4/2016 |
| TW | 200927962 A | 7/2009 |

OTHER PUBLICATIONS

Korean Office Action (Application No. 10-2019-7004134) dated Oct. 15, 2021 (with English translation).
Taiwanese Office Action (with English translation) dated Jul. 15, 2022 (Application No. 110123519).
Chinese Decision of Rejection (Application No. 202210137305.1) dated May 27, 2023 (with English translation) (16 pages).
Chinese Office Action (with English translation) dated Jan. 13, 2023 (Application No. 202210137305.1).
Japanese Office Action (with English translation) dated Sep. 9, 2022 (Application No. 2021-138373).
Korean Office Action (Application No. 10-2022-7035432) dated Sep. 22, 2023 (with English translation).
Chinese Office Action (Application No. 202010084742.2) dated Aug. 18, 2021 (with English translation).
International Search Report and Written Opinion (Application No. PCT/JP2017/032938) dated Nov. 7, 2017.
Chinese Office Action (Application No. 201710908172.2) dated Oct. 22, 2018 (with English translation).
English translation of International Preliminary Report on Patentability (Chapter I) (Application No. PCT/JP2017/032938) dated Apr. 11, 2019.
Partial European Search Report (Application No. 17855714.6) dated Apr. 6, 2020.
Extended European Search Report (Application No. 17855714.6) dated Jul. 13, 2020.
European Office Action (Application No. 17 885 714.6) dated Dec. 10, 2020.
Taiwanese Office Action (Application No. 106132348) dated Nov. 19, 2020 (with English translation).
Chinese Office Action (Application No. 202010084742.2) dated May 21, 2021 (with English translation).
Japanese Office Action (Application No. 2017-550654) dated Jul. 9, 2021 (with English translation).
Korean Office Action (Application No. 10-2022-7035432) dated Oct. 31, 2022 (with English translation).
Korean Office Action (with English translation) dated May 8, 2024 (Application No. 10-2024-7013321).

* cited by examiner

| | INTERPOSED SHEET | THERMAL EXPANSION COEFFICIENT (ppm/°C) | THERMAL EXPANSION COEFFICIENT DIFFERENCE (ppm/°C) | THICKNESS T0 OF DEPOSITION MASK | | | | | | |
|---|---|---|---|---|---|---|---|---|---|---|
| | | | | 40μm | 35μm | 30μm | 25μm | 20μm | 18μm | 15μm |
| EXAMPLE 1 | Invar | 1 | 0 | ○ | ○ | ○ | ○ | ○ | ○ | ○ |
| EXAMPLE 2 | 42 ALLOY | 4.2 | 3.2 | ○ | ○ | ○ | ○ | ○ | ○ | ○ |
| EXAMPLE 3 | ACRYLIC-IMPREGNATED PAPER | 8 | 7 | ○ | ○ | ○ | ○ | ○ | ○ | ○ |
| COMPARATIVE EXAMPLE 1 | SUS430 | 10 | 9 | ○ | ○ | ○ | × | × | × | × |
| COMPARATIVE EXAMPLE 2 | HIGH-MOLECULAR-WEIGHT PE | 12 | 11 | ○ | × | × | × | × | × | × |
| COMPARATIVE EXAMPLE 3 | PET | 15 | 14 | ○ | × | × | × | × | × | × |
| COMPARATIVE EXAMPLE 4 | LOW-MOLECULAR-WEIGHT PE | 17 | 16 | ○ | × | × | × | × | × | × |

FIG.42

DEPOSITION MASK PACKAGE AND DEPOSITION MASK PACKAGING METHOD

CROSS REFERENCE TO RELATED APPLICATIONS

This application is a division of U.S. application Ser. No. 16/352,117, filed Mar. 13, 2019, which is a continuation of International Application No. PCT/JP2017/032938, filed Sep. 12, 2017, which designated the United States, the entireties of which are incorporated herein by reference.

FIELD OF THE INVENTION

The present embodiments relate to a deposition mask package obtained by packaging a deposition mask including a plurality of through-holes and a deposition mask packaging method.

BACKGROUND OF THE INVENTION

In recent years, it is required for display devices used in portable devices, such as a smartphone and a tablet PC, to have high definition, for example, a pixel density of 400 ppi or higher. In addition, there is an increasing demand for adapting to ultra-high definition even with respect to the portable devices. In this case, it is required for the display devices to have a pixel density of, for example, 800 ppi or higher.

Among the display devices, an organic EL display device has drawn attention due to good responsiveness, low power consumption, and high contrast. As a method of forming pixels of the organic EL display device, a method of forming pixels in a desired pattern using a deposition mask in which through-holes, arranged in a desired pattern, are formed is known. Specifically, first, the deposition mask is brought into close contact with a substrate for the organic EL display device, and then, a deposition step of introducing both the deposition mask and the substrate, in close contact with each other, into the deposition device to cause an organic material to be deposited on the substrate. In this case, it is required to precisely reproduce a position and a shape of the through-hole of the deposition mask in accordance with a design in order to precisely prepare the organic EL display device having a high pixel density.

As a method of manufacturing the deposition mask, a method of forming a through-hole in a metal plate by etching using a photolithography technique is known, for example, as disclosed in JP 5382259 B2. For example, a first resist pattern is first formed on a first surface of the metal plate, and a second resist pattern is formed on a second surface of the metal plate. Next, a region of the first surface of the metal plate that is not covered with the first resist pattern is etched to form a first opening on the first surface of the metal plate. Thereafter, a region of the second surface of the metal plate that is not covered with the second resist pattern is etched to form a second opening on the second surface of the metal plate. At this time, it is possible to form the through-hole penetrating the metal plate by performing etching such that the first opening and the second opening communicate with each other. The metal plate for production of the deposition mask is obtained, for example, by rolling a base material such as an iron alloy.

In addition, as the method of manufacturing the deposition mask, a method of manufacturing a deposition mask using a plating process is known, for example, as disclosed in JP 2001-234385 A. For example, a base material having conductivity is produced first in the method described in JP 2001-234385 A. Next, a resist pattern is formed on the base material with a predetermined gap therebetween. This resist pattern is provided at positions where through-holes of the deposition mask need to be formed. Thereafter, a plating solution is supplied to the gap of the resist pattern to precipitate a metal layer on the base material by an electrolytic plating process. Thereafter, the deposition mask having the plurality of through-holes formed therein can be obtained by separating the metal layer from the base material. When the plating process is used in this manner, it is possible to achieve high definition of the through-hole.

SUMMARY OF THE INVENTION

When the deposition mask is sandwiched between a receiving portion and a lid portion made of a plastic board or the like at the time of transporting the deposition mask, a force is directly applied from the receiving portion and the lid portion to the deposition mask. Thus, there is a problem that the deposition mask taken out after unpacking may be plastically deformed. In addition, there is a possibility that the deposition mask is plastically deformed even by an impact received during transportation.

In addition, there is a case where a plurality of deposition masks is stacked in one package when transporting the deposition mask in order to improve transportation efficiency. In this case, there is a risk that a deposition mask may be plastically deformed at the time of taking out individual deposition masks because a through-hole of one of adjacent deposition masks and a through-hole of the other deposition mask are caught by each other. In order to deal with such a risk, interposed paper is inserted between a pair of adjacent deposition masks.

However, when a temperature change occurs during transportation, a positional shift is generated due to a difference between a dimensional change caused by thermal expansion of the deposition mask and a dimensional change caused by thermal expansion of the interposed paper so that there is a problem that wrinkles or scratches are formed in the deposition mask. In particular, when a thickness of the deposition mask is reduced, the deposition mask is likely to be plastically deformed.

When deposition materials are deposited on a substrate using a deposition mask, the deposition material adheres not only to the substrate but also to the deposition mask. For example, some of the deposition materials are directed toward the substrate along a direction which is greatly inclined with respect to the normal direction of the deposition mask, such deposition materials reach and adhere to a wall surface of the through-hole of the deposition mask before reaching the substrate. In this case, it is conceivable that the deposition material hardly adheres to a region of the substrate positioned in the vicinity of the wall surface of the through-hole of the deposition mask, and as a result, a thickness of the adhering deposition material becomes smaller than that in the other portion or a portion where the deposition material does not adhere is generated. That is, it is conceivable that deposition in the vicinity of the wall surface of the through-hole of the deposition mask becomes unstable. As a result, the light emission efficiency of the organic EL display device deteriorates.

In order to solve such a problem, it is conceivable to reduce the thickness of the metal plate used to manufacture the deposition mask. This is because it is possible to reduce the height of the wall surface of the through-hole of the deposition mask by lowering the thickness of the metal plate and to reduce the proportion of the deposition materials adhering to the wall surface of the through-hole.

In this manner, the thickness of the deposition mask tends to become thin in order to prevent the deterioration of the light emission efficiency of the organic EL display device. Thus, it is desired to prevent plastic deformation during transportation even in the thin deposition mask.

An object of the present embodiments is to provide a deposition mask package and a deposition mask packaging method capable of preventing plastic deformation of a deposition mask during transportation.

The present embodiment relates to a deposition mask package including: a receiving portion; a lid portion that faces the receiving portion; a deposition mask that is arranged between the receiving portion and the lid portion and has an effective region in which a plurality of through-holes is formed. The receiving portion has a first opposing surface facing the lid portion and a concave portion provided on the first opposing surface. The concave portion is covered with a first flexible film. The effective region of the deposition mask is arranged on the concave portion with the first flexible film interposed therebetween.

In the deposition mask package according to the present embodiment, ends on both sides in a first direction of the deposition mask may be arranged on the first opposing surface of the receiving portion.

In the deposition mask package according to the present embodiment, a dimension of the concave portion in a second direction orthogonal to the first direction may be larger than a dimension of the deposition mask in the second direction.

In the deposition mask package according to the present embodiment, an interposed sheet may be interposed between the deposition mask and the first flexible film, and a dimension of the interposed sheet in a second direction orthogonal to the first direction may be smaller than a dimension of the concave portion in the second direction.

In the deposition mask package according to the present embodiment, the first flexible film may be a PET film.

In the deposition mask package according to the present embodiment, the first flexible film may be antistatic-coated.

In the deposition mask package according to the present embodiment, a second flexible film may be interposed between the lid portion and the deposition mask.

In the deposition mask package according to the present embodiment, the receiving portion and the lid portion may be connected via a hinge portion.

The deposition mask package according to the present embodiment may further include a sealing bag that seals the receiving portion and the lid portion.

The deposition mask package according to the present embodiment may further include an impact sensor that detects an impact applied to the deposition mask.

In addition, the present embodiment relates to a deposition mask packaging method for packaging a deposition mask having an effective region in which a plurality of through-holes is formed, the deposition mask packaging method including: preparing a receiving portion that has a first opposing surface and a concave portion provided on the first opposing surface and covered with a first flexible film; obtaining the deposition mask placed on the receiving portion; arranging a lid portion on the deposition mask such that the receiving portion and the lid portion face each other; and sandwiching the deposition mask between the receiving portion and the lid portion. In the arranging of the deposition mask, the effective region of the deposition mask is placed on the concave portion with the first flexible film interposed therebetween.

The present embodiment relates to a deposition mask package including: a receiving portion; a lid portion that faces the receiving portion; and a deposition mask stacked body arranged between the receiving portion and the lid portion. The deposition mask stacked body includes: a deposition mask having a first surface, a second surface positioned opposite to the first surface, and a plurality of through-holes extending from the first surface to the second surface; and a plurality of interposed sheets stacked on the first surface and the second surface of the deposition mask. A difference between a thermal expansion coefficient of the deposition mask and the thermal expansion coefficient of the interposed sheet is 7 ppm/° C. or less.

In the deposition mask package according to the present embodiment, the interposed sheet may have a dimension that enables a circumferential edge of the interposed sheet to protrude from the deposition mask over the entire circumference as viewed along a stacking direction of the deposition mask.

In the deposition mask package according to the present embodiment, the deposition mask and the interposed sheet may be formed using an iron alloy containing nickel in an amount of 30% by mass to 54% by mass.

In the deposition mask package according to the present embodiment, the deposition mask and the interposed sheet may be formed using an iron alloy containing chromium.

In the deposition mask package according to the present embodiment, a material forming the interposed sheet may be identical to a material forming the deposition mask.

In the deposition mask package according to the present embodiment, a thickness of the interposed sheet may be 20 μm to 100 μm.

In the deposition mask package according to the present embodiment, a thickness of the deposition mask may be 15 μm or more.

In the deposition mask package according to the present embodiment, the receiving portion may have a first opposing surface facing the lid portion and a concave portion provided on the first opposing surface, ends on both sides in a first direction of the deposition mask may be arranged on the first opposing surface of the receiving portion, and a dimension of the interposed sheet in a second direction orthogonal to the first direction may be smaller than a dimension of the concave portion in the second direction.

In addition, the present embodiment relates to a deposition mask packaging method for packaging a deposition mask, which includes a first surface, a second surface positioned opposite to the first surface, and a plurality of through-holes extending from the first surface to the second surface, the deposition mask packaging method including: obtaining a deposition mask stacked body having the deposition mask and an interposed sheet stacked on the first surface and the second surface of the deposition mask, the deposition mask stacked body placed on the receiving portion; arranging a lid portion on the deposition mask stacked body such that the receiving portion and the lid portion face each other; and sandwiching the deposition mask stacked body between the receiving portion and the lid portion. A difference between a thermal expansion coefficient of the deposition mask and a thermal expansion coefficient of the interposed sheet is 7 ppm/° C. or less.

According to the present embodiment, it is possible to prevent the deposition mask from being plastically deformed during the transportation.

BRIEF DESCRIPTION OF THE DRAWINGS

FIG. 42 is a table illustrating transportation test results of Examples of the present embodiment.

DETAILED DESCRIPTION OF THE INVENTION

Figure 1:
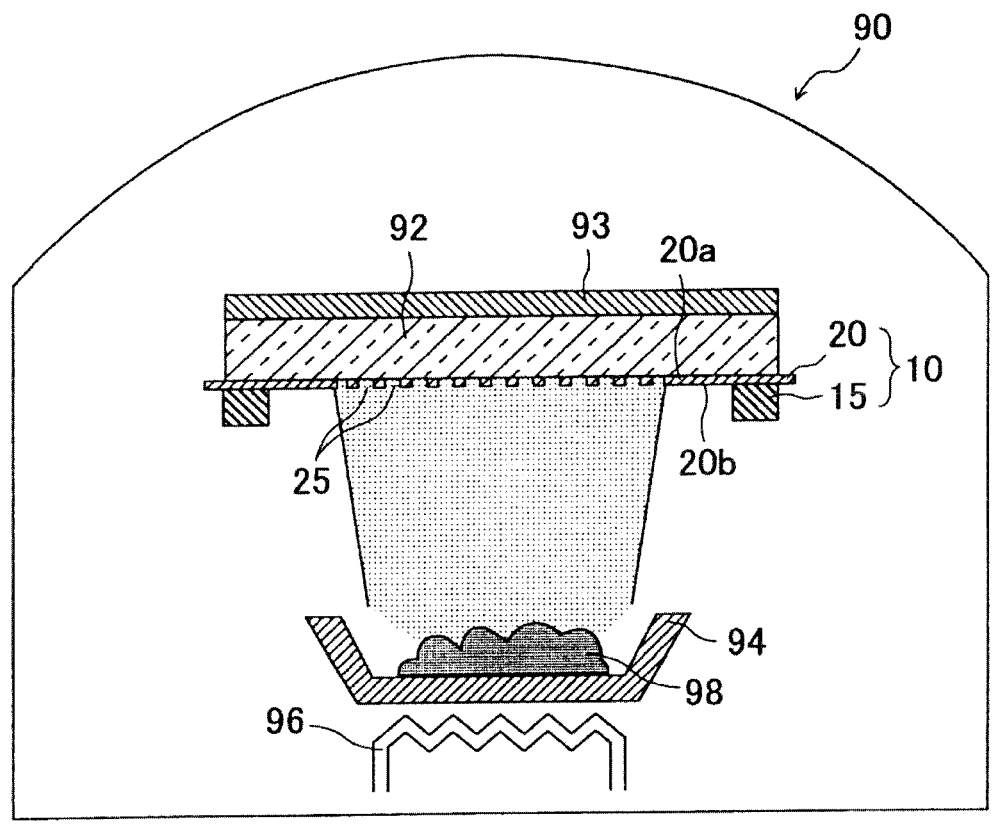
FIG. 1 is a view illustrating a deposition device including a deposition mask device according to a present embodiment.

Hereinafter, a present embodiment will be described with reference to the drawings. Incidentally, in the drawings appended to the specification of the present application, scales and horizontal and vertical dimension ratios are appropriately changed and exaggerated as compared to actual ones thereof in order for convenience of illustration and facilitating the understanding.

FIGS. 1 to 26 are views for describing a deposition mask according to a present embodiment. In the following embodiment and modifications thereof, a description will be given by exemplifying the deposition mask used for patterning of an organic material in a desired pattern on a substrate when manufacturing an organic EL display device. However, the present embodiment is not limited to such applications but can be applied to deposition masks used for various purposes.

Incidentally, in the present specification, the terms "plate", "sheet", and "film" are not distinguished from each other based solely on differences in nomenclature. For example, the "plate" is a concept that also includes a member which can be called a sheet or a film.

In addition, the "plate plane (a sheet plane or a film plane)" indicates a surface that coincides with a plane direction of a target plate-like member (a sheet-like member or a film-like member) in a case where the target plate-like (sheet-like or film-like) member is viewed widely as a whole. In addition, a normal direction used with respect to the plate-like (sheet-like or film-like) member indicates a normal direction with respect to the plate plane (the sheet plane or the film plane) of the member.

In addition, terms, lengths, angles, and values of physical characteristics specifying shapes, geometric conditions, physical characteristics, and extent thereof used in the present specification (for example, the terms such as "parallel", "orthogonal", "same", and "equivalent") are interpreted including a range of extent where similar functions can be expected without being bound by strict meaning.

(Deposition Device)

First, a deposition device 90 that performs a deposition process to deposit a deposition material on an object will be described with reference to FIG. 1. As illustrated in FIG. 1, the deposition device 90 includes a deposition source (for example, a crucible 94), a heater 96, and a deposition mask device 10. The crucible 94 contains a deposition material 98 such as an organic light-emitting material. The heater 96 heats the crucible 94 to evaporate the deposition material 98. The deposition mask device 10 is arranged to face the crucible 94.

(Deposition Mask Device)

Hereinafter, the deposition mask device 10 will be described. As illustrated in FIG. 1, the deposition mask device 10 includes a deposition mask 20 and a frame 15 supporting the deposition mask 20. The frame 15 supports the deposition mask 20 in the state of being pulled in a longitudinal direction (first direction) such that the deposition mask 20 is not deflected. As illustrated in FIG. 1, the deposition mask device 10 is arranged inside the deposition device 90 such that the deposition mask 20 faces a substrate which is an object to which the deposition material 98 is attached, for example, an organic EL substrate 92. In the following description, a surface of the deposition mask 20 on the organic EL substrate 92 side is referred to as a first surface 20a, and a surface on the opposite side of the first surface 20a is referred to as a second surface 20b. The frame 15 faces the second surface 20b of the deposition mask 20.

As illustrated in FIG. 1, the deposition mask device 10 may include a magnet 93 arranged on a surface of the organic EL substrate 92 opposite to the deposition mask 20. Since the magnet 93 is provided, the deposition mask 20 can be brought into close contact with the organic EL substrate 92 by attracting the deposition mask 20 to the magnet 93 side by a magnetic force.

Figure 3:
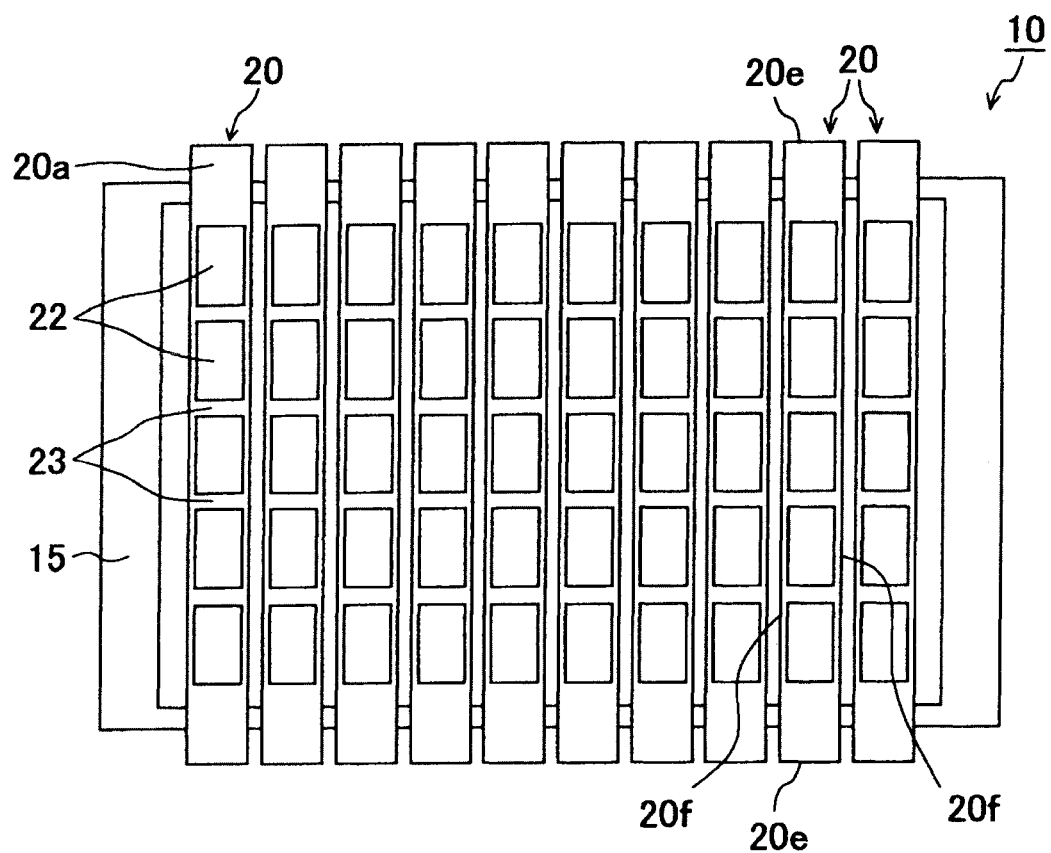
FIG. 3 is a plan view illustrating the deposition mask device according to the present embodiment.

FIG. 3 is a plan view illustrating a case where the deposition mask device 10 is viewed from the first surface 20a side of the deposition mask 20. As illustrated in FIG. 3, the deposition mask device 10 includes a plurality of the deposition masks 20 each having a substantially rectangular shape in a plan view, and each of the deposition masks 20 is welded and fixed onto the frame 15 at a pair of ends 20e in the longitudinal direction of the deposition mask 20.

The deposition mask 20 includes a plurality of through-holes 25 penetrating through the deposition mask 20. The deposition material 98 that has vaporized from the crucible 94 and reached the deposition mask device 10 passes through the through-hole 25 of the deposition mask 20 and adheres to the organic EL substrate 92. As a result, the deposition material 98 can be deposited on the surface of the organic EL substrate 92 in a desired pattern corresponding to positions of the through-holes 25 of the deposition mask 20.

Figure 2:
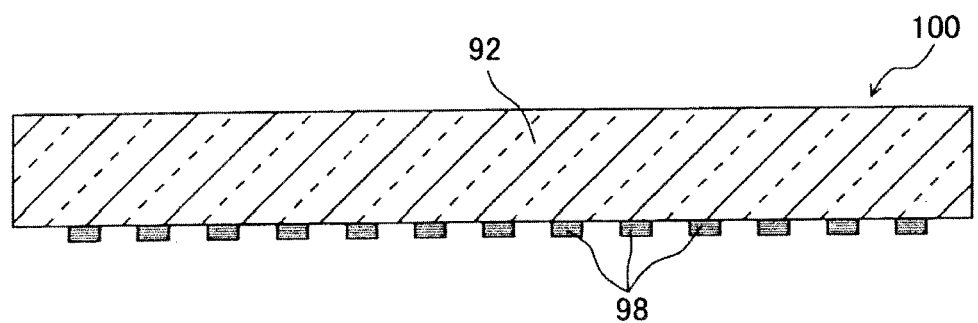
FIG. 2 is a cross-sectional view illustrating an organic EL display device manufactured using the deposition mask device illustrated in FIG. 1.

FIG. 2 is a cross-sectional view illustrating an organic EL display device 100 manufactured using the deposition device 90 of FIG. 1. The organic EL display device 100 includes the organic EL substrate 92 and a pixel containing the deposition material 98 provided in a pattern.

Incidentally, when it is desired to perform color display using a plurality of colors, the deposition devices 90 each of which has the deposition mask 20 corresponding to each color are prepared, and the organic EL substrate 92 is sequentially introduced into the respective deposition devices 90. As a result, for example, an organic light-emitting material for red, an organic light-emitting material for green, and an organic light-emitting material for blue can be sequentially deposited on the organic EL substrate 92.

Meanwhile, there is a case where the deposition process is performed inside the deposition device 90 which becomes high-temperature atmosphere. In this case, the deposition mask 20, the frame 15, and the organic EL substrate 92 held inside the deposition device 90 are also heated during the deposition process. At this time, each of the deposition mask 20, the frame 15, and the organic EL substrate 92 illustrates behavior of a dimensional change based on each thermal expansion coefficient. In this case, if thermal expansion coefficients of the deposition mask 20, the frame 15, and the organic EL substrate 92 are greatly different from each other, misalignment due to a difference in dimensional changes among them is generated, and as a result, dimensional accuracy and positional accuracy of the deposition material 98 adhering onto the organic EL substrate 92 deteriorate.

In order to solve such a problem, it is preferable that thermal expansion coefficients of the deposition mask 20 and the frame 15 be the same value as thermal expansion coefficient of the organic EL substrate 92. For example, when a glass substrate is used as the organic EL substrate 92, an iron alloy containing nickel can be used as a main material of the deposition mask 20 and the frame 15. For example, it is possible to use an iron alloy containing 30% by mass to 54% by mass of nickel as a material of the metal plate forming the deposition mask 20. Specific examples of the iron alloy containing nickel can include an invar material containing 34% by mass to 38% by mass of nickel, a super invar material containing cobalt in addition to 30% by mass to 34% by mass of nickel, and a low thermal expansion Fe—Ni plated alloy containing 48% by mass to 54% by mass of nickel. Incidentally, a numerical range expressed by the symbol "~" includes numerical values placed before and after the symbol "~" in the present specification. For example, a numerical range defined by the expression "34 to 38% by mass" is identical to a numerical range defined by an expression "34% by mass or higher and 38% by mass or lower".

Incidentally, when temperature of the deposition mask 20, the frame 15, and the organic EL substrate 92 does not reach high temperature during the deposition process, it is not particularly necessary to set thermal expansion coefficients of the deposition mask 20 and the frame 15 to the same value as thermal expansion coefficient of the organic EL substrate 92. In this case, a material other than the above-described iron alloy may be used as the material forming the deposition mask 20. For example, an iron alloy other than the above-described nickel-containing iron alloy such as an iron alloy containing chromium may be used. For example, an iron alloy referred to as a so-called stainless steel can be used as the iron alloy containing chromium. In addition, an alloy other than the iron alloy such as nickel and a nickel-cobalt alloy may be used.

(Deposition Mask)

Figure 4:
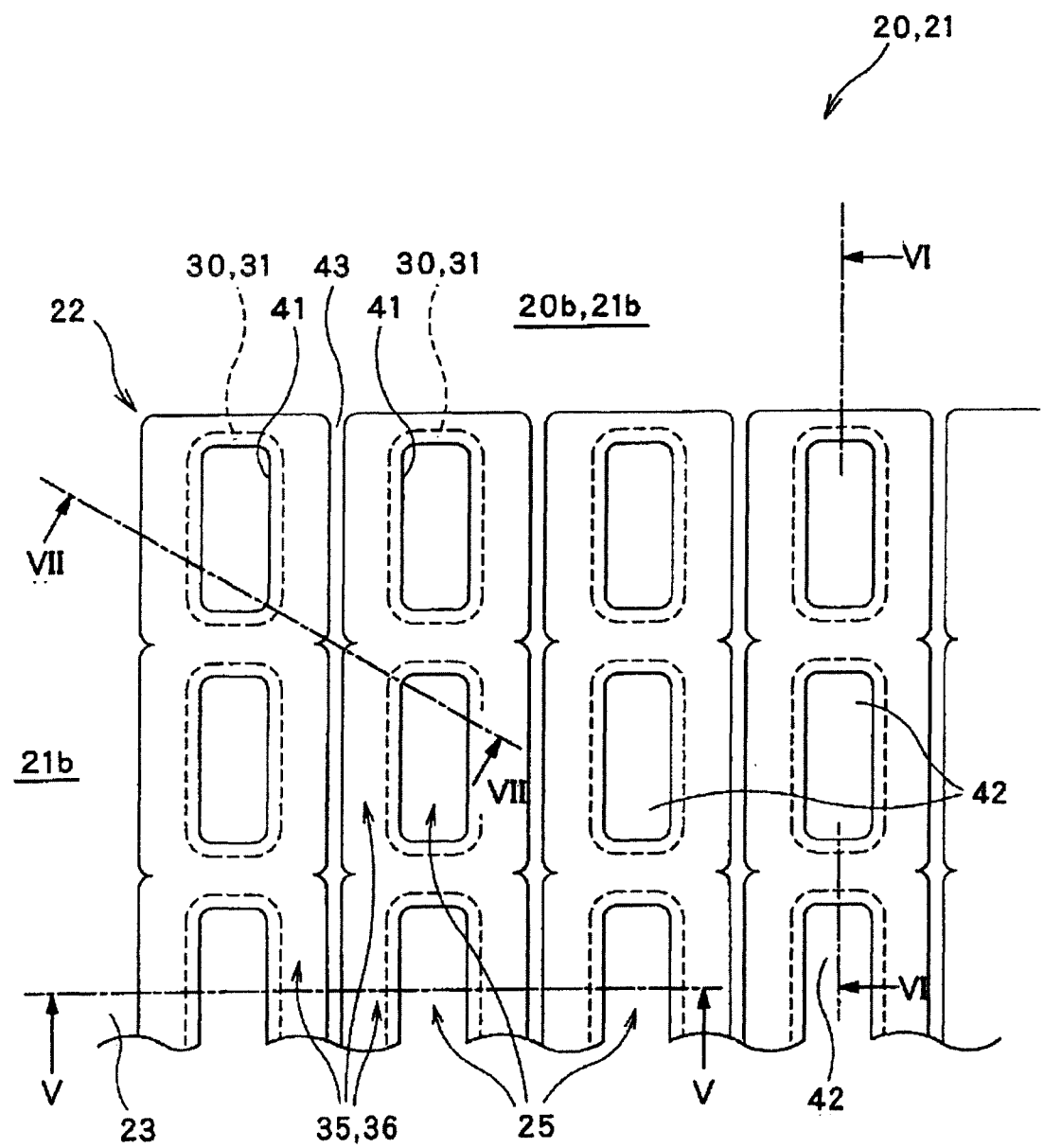
FIG. 4 is a partial plan view illustrating an effective region of the deposition mask illustrated in FIG. 3.
Figure 5:
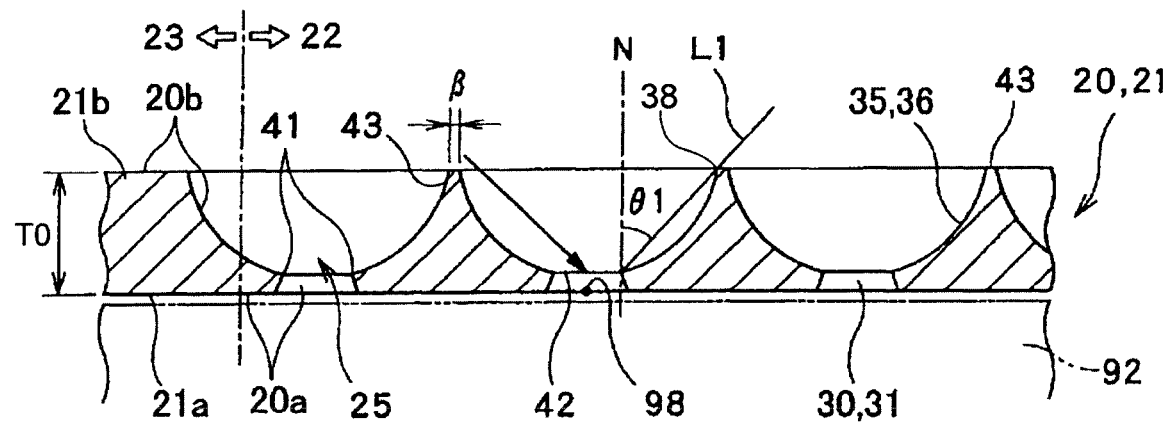
FIG. 5 is a cross-sectional view taken along the line V-V in FIG.

Next, the deposition mask 20 will be described in detail. As illustrated in FIGS. 3 to 5, the deposition mask 20 includes an effective region 22 in which a through-hole 25 extending from the first surface 20a to the second surface 20b is formed, and a peripheral region 23 surrounding the effective region 22. The peripheral region 23 is a region configured to support the effective region 22 and is not a region that allows a deposition material 98, which has been intended to be deposited on the organic EL substrate 92, to pass therethrough. For example, the effective region 22 is a region facing a display region of the organic EL substrate 92 in the deposition mask 20.

As illustrated in FIG. 3, the effective regions 22 has a substantially quadrangular shape in a plan view, more accurately, a substantially rectangular outline in a plan view, for example. Although not illustrated, each of the effective regions 22 can have outlines of various shapes in accordance with a shape of the display region of the organic EL substrate 92. For example, each of the effective regions 22 may have a circular outline.

As illustrated in FIG. 3, a plurality of the effective regions 22 is arranged at predetermined intervals along the longitudinal direction of the deposition mask 20. The single effective region 22 corresponds to one display region of the organic EL display device 100. Thus, it is possible to deposit the organic EL display device 100 with multiple surfaces according to the deposition mask device 10 illustrated in FIG. 1. As illustrated in FIG. 4, a plurality of the through-holes 25 in the effective region 22 is regularly arranged at predetermined pitches along two directions orthogonal to each other.

Hereinafter, shapes of the through-hole 25 and a peripheral part thereof will be described in detail.

(Deposition Mask Manufactured by Etching Process)

Here, the shapes of the through-hole 25 and the peripheral part thereof in the case where the deposition mask 20 is formed by an etching process will be described.

Figure 6:
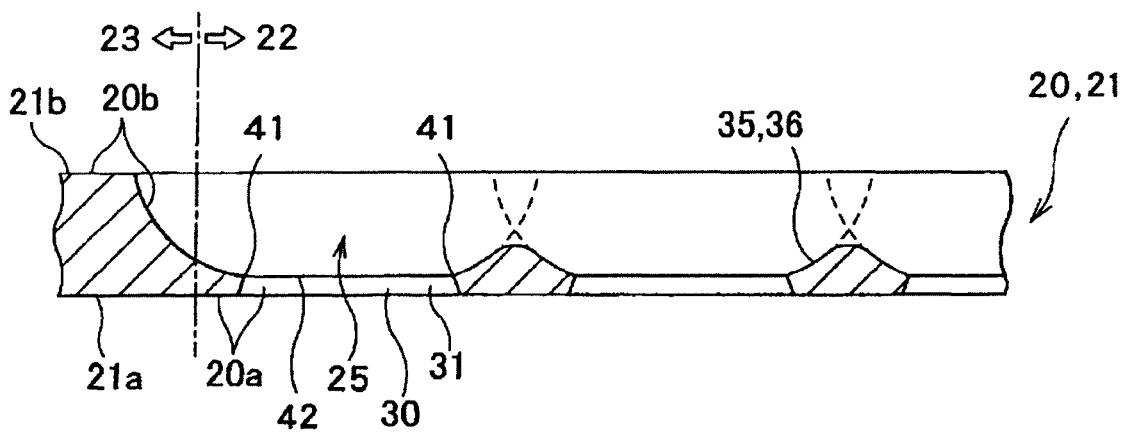
FIG. 6 is a cross-sectional view taken along the line VI-VI of FIG. 4.
Figure 7:
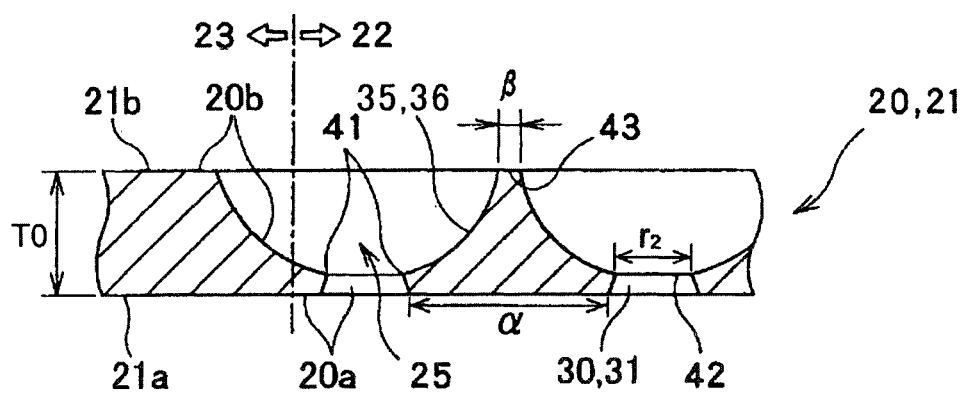
FIG. 7 is a cross-sectional view taken along the line VII-VII of FIG. 4.

FIG. 4 is an enlarged plan view illustrating the effective region 22 from the second surface 20b side of the deposition mask 20 manufactured by the etching process. As illustrated in FIG. 4, the plurality of through-holes 25 formed in each of the effective regions 22 are arrayed at predetermined pitches along the two directions orthogonal to each other in the effective region 22 in the illustrated example. An example of the through-hole 25 will be described in more detail mainly with reference to FIGS. 5 to 7. FIGS. 5 to 7 are cross-sectional views taken along a direction V-V to a direction VII-VII of the effective region 22 of FIG. 4, respectively. Incidentally, a boundary line between the effective region 22 and the peripheral region 23 illustrated in FIGS. 5 to 7 is an example, and a position of this boundary line is arbitrary. For example, this boundary line may be arranged in a region where the second concave portion 35 is not formed (the left side of the second concave portion 35 on the leftmost side in FIG. 5).

As illustrated in FIGS. 5 to 7, the plurality of through-holes 25 penetrates from the first surface 20a, which is one side along a normal direction N of the deposition mask 20, through the second surface 20b which is the other side along the normal direction N of the deposition mask 20. In the illustrated example, a first concave portion 30 (or a first opening 30) is formed by etching on the first surface 21a of the metal plate 21, which is one side in the normal direction N of the deposition mask 20, and a second concave portion 35 (or a second opening 35) is formed on the second surface 21b of the metal plate 21 which is the other side in the normal direction N of the deposition mask 20 as will be described in detail later. The first concave portion 30 is connected to the second concave portion 35 so that the second concave portion 35 and the first concave portion 30 communicate with each other. The through-hole 25 is formed of the second concave portion 35 and the first concave portion 30 connected to the second concave portion 35.

As illustrated in FIGS. 5 to 7, the opening area of each of the second concave portions 35 in a cross section along a plate plane of the deposition mask 20 at each position along the normal direction N of the deposition mask 20 gradually decreases from the second surface 20b side to the first surface 20a side of the deposition mask 20. Similarly, the opening area of each of the first concave portions 30 in the cross section along the plate plane of the deposition mask 20 at each position along the normal direction N of the deposition mask 20 gradually decreases from the first surface 20a side to the second surface 20b of the deposition mask 20.

As illustrated in FIGS. 5 to 7, a wall surface 31 of the first concave portion 30 and a wall surface 36 of the second concave portion 35 are connected via a circumferential connecting portion 41. The connecting portion 41 is defined by a ridge of an overhang where the wall surface 31 of the first concave portion 30 inclined with respect to the normal direction N of the deposition mask 20 and the wall surface 36 of the second concave portion 35 inclined with respect to the normal direction N of the deposition mask 20 are joined. Further, the connecting portion 41 defines a penetrating portion 42 where the opening area of the through-hole 25 is the minimum in a plan view of the deposition mask 20.

As illustrated in FIGS. 5 to 7, the two adjacent through-holes 25 are spaced apart from each other along the plate plane of the deposition mask 20 on a surface on the other side along the normal direction N of the deposition mask 20, that is, on the first surface 20a of the deposition mask 20. That is, when the first concave portion 30 is produced by etching the metal plate 21 from the first surface 21a side of the metal plate 21 corresponding to the first surface 20a of the deposition mask 20 as in a manufacturing method to be described later, the first surface 21a of the metal plate 21 remains between the two adjacent first concave portion 30.

Similarly, the two adjacent second concave portions 35 may be also spaced apart from each other along the plate plane of the deposition mask 20 on one side along the normal direction N of the deposition mask 20, that is, on the second surface 20b side of the deposition mask 20 as illustrated in FIGS. 5 and 7. That is, the second surface 21b of the metal plate 21 may remain between the two adjacent second concave portions 35. In the following description, a portion of the effective region 22 on the second surface 21b of the metal plate 21 that remains without being etched is also referred to as a top portion 43. As the deposition mask 20 is produced so as to leave such a top portion 43, it is possible to make the deposition mask 20 have sufficient strength. As a result, it is possible to suppress the deposition mask 20 from being damaged during conveyance, for example. Incidentally, if a width β of the top portion 43 is too large, shadow is generated in the deposition step so that the utilization efficiency of the deposition material 98 may decrease. Therefore, it is preferable that the deposition mask 20 be produced such that the width β of the top portion 43 does not become excessively large. For example, the width of the top portion 43 is preferably 2 μm or less. Incidentally, the width β of the top portion 43 generally varies depending on a direction in which the deposition mask 20 is cut. For example, the widths β of the top portion 43 illustrated in FIGS. 5 and 7 may be different from each other. In this case, the deposition mask 20 may be configured such that the width β of the top portion 43 becomes 2 μm or less even when the deposition mask 20 is cut in any direction.

Incidentally, etching may be performed such that two adjacent second concave portions 35 are connected depending on places as illustrated in FIG. 6. That is, a place where the second surface 21b of the metal plate 21 does not remain may exist between the two adjacent second concave portions 35. In addition, etching may be performed such that the two adjacent second concave portions 35 are connected across the entire second surface 21b although not illustrated.

When the deposition mask device 10 is accommodated in the deposition device 90 as illustrated in FIG. 1, the first surface 20a of the deposition mask 20 faces the organic EL substrate 92 as illustrated by a two-dot chain line in FIG. 5, and the second surface 20b of the deposition mask 20 is positioned on a side of the crucible 94 holding the deposition material 98. Therefore, the deposition material 98 passes through the second concave portion 35 whose opening area gradually decreases and adheres to the organic EL substrate 92. The deposition material 98 not only moves along the normal direction N of the organic EL substrate 92 from the crucible 94 toward the organic EL substrate 92 but also moves in a direction which is greatly inclined with respect to the normal direction N of the organic EL substrate 92 as illustrated by an arrow directed from the second surface 20b side to the first surface 20a in FIG. 5. At this time, when the thickness of the deposition mask 20 is large, most of the deposition material 98 that obliquely moves reaches and adheres to the wall surface 36 of the second concave portion 35 before reaching the organic EL substrate 92 through the through-hole 25. Therefore, it is considered that it is preferable to reduce the thickness T0 of the deposition mask 20 so as to reduce the height of the wall surface 36 of the second concave portion 35 or the wall surface 31 of the first concave portion 30 in order to enhance the utilization efficiency of the deposition material 98. That is, it can be said that it is preferable to use the metal plate 21 having the thickness, as small as possible, within a range where the strength of the deposition mask 20 can be secured, as the metal plate 21 to form the deposition mask 20. In consideration of this point, the thickness T0 of the deposition mask 20 is preferably set to 85 μm or less, for example, 5 μm to 85 μm in the present embodiment. Alternatively, the thickness T0 is set to 80 μm or less, for example, 10 μm to 80 μm, or 20 μm to 80 μm. The thickness T0 of the deposition mask 20 may be set to 40 μm or less, for example, 10 to 40 μm, or 20 to 40 μm in order to further improve the accuracy of deposition. Incidentally, the thickness T0 is a thickness of the peripheral region 23, that is, a thickness of the portion of the deposition mask 20 where the first concave portion 30 and the second concave portion 35 are not formed. Therefore, it can be said that the thickness T0 is the thickness of the metal plate 21.

In FIG. 5, a minimum angle of a straight line L1, which passes through the connecting portion 41, which is the portion having the minimum opening area of the through-hole 25, and another arbitrary position of the wall surface 36 of the second concave portion 35, with respect to the normal direction N of the deposition mask 20 is indicated by a reference sign θ1. That is, a path that forms the angle θ1 with respect to the normal direction N of the deposition mask 20 among paths of the deposition material 98 passing through the end 38 of the through-hole 25 (the second concave portion 35) on the second surface 20b side of the deposition mask 20, the paths that can reach the organic EL substrate 92 is represented by a reference sign L1, which is similar to the case illustrated in FIG. 21 to be described later. It is advantageous to increase the angle θ1 in order to allow the deposition material 98 moving obliquely to reach the organic EL substrate 92 as much as possible without reaching the wall surface 36. Upon increasing the angle θ1, it is also advantageous to not only reduce the thickness T0 of the deposition mask 20 but also reduce the above-described width β of the top portion 43.

In FIG. 7, a reference sign a represents a width of a portion (hereinafter also referred to as a rib portion) remaining without being etched in the effective region 22 of the first surface 21a of the metal plate 21. The width α of the rib portion and a dimension $r_2$ of the penetrating portion 42 are appropriately determined according to dimensions of the organic EL display device and the number of display pixels. Table 1 illustrates exemplary values of the width a of the rib portion and the dimension $r_2$ of the penetrating portion 42 obtained depending on the number of display pixels, in a 5-inch organic EL display device.

TABLE 1

| NUMBER OF DISPLAY PIXELS | WIDTH OF RIB PORTION | DIMENSION OF PENETRATING PORTION |
| --- | --- | --- |
| FHD (Full High Definition) | 20 μm | 40 μm |
| WQHD (Wide Quad High Definition) | 15 μm | 30 μm |
| UHD (Ultra High Definition) | 10 μm | 20 μm |

Figure 8:
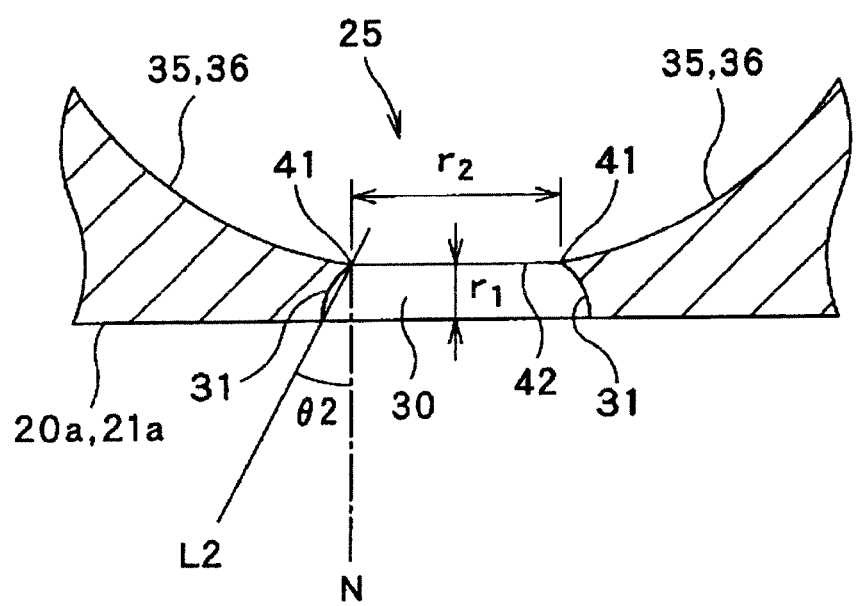
FIG. 8 is an enlarged cross-sectional view illustrating a through-hole illustrated in FIG. 5 and a region in the vicinity thereof.

Although not limited, the deposition mask 20 according to the present embodiment is particularly advantageous in the case of manufacturing an organic EL display device having a pixel density of 450 ppi or more. Hereinafter, exemplary dimensions of the deposition mask 20 required to manufacture such an organic EL display device having a high pixel density will be described with reference to FIG. 8. FIG. 8 is an enlarged cross-sectional view illustrating the through-hole 25 of the deposition mask 20 illustrated in FIG. 5 and the vicinity thereof.

In FIG. 8, a distance from the first surface 20a of the deposition mask 20 to the connecting portion 41 in the direction along the normal direction N of the deposition mask 20, that is, a height of the wall surface 31 of the first concave portion 30 is represented by a reference sign $r_1$ as a parameter relating to a shape of the through-hole 25. Further, a dimension of the first concave portion 30 at a portion where the first concave portion 30 is connected to the second concave portion 35, that is, a dimension of the penetrating portion 42 is represented by a reference sign $r_2$. In addition, an angle of a straight line L2, which connects the connecting portion 41 and a distal edge of the first concave portion 30 on the first surface 21a of the metal plate 21, with respect to the normal direction N of the metal plate 21 is represented by a reference sign θ2 in FIG. 8.

In the case of manufacturing an organic EL display device having a pixel density of 450 ppi or more, the dimension $r_2$ of the penetrating portion 42 is preferably set to 10 to 60 μm. As a result, it is possible to provide the deposition mask 20 capable of manufacturing the organic EL display device having a high pixel density. Preferably, the height $r_1$ of the wall surface 31 of the first concave portion 30 is set to 6 μm or less.

Next, the above-described angle θ2 illustrated in FIG. 8 will be described. The angle θ2 corresponds to a maximum value of an inclination angle of the deposition material 98 that can reach the organic EL substrate 92 among the deposition materials 98 inclined with respect to the normal direction N of the metal plate 21 and flown to pass through the penetrating portion 42 in the vicinity of the connecting portion 41. This is because the deposition materials 98 that have passed through the connecting portion 41 and flown with an inclination angle larger than the angle θ2 adhere to the wall surface 31 of the first concave portion 30 before reaching the organic EL substrate 92. Therefore, it is possible to prevent the deposition material 98 that have flown with a large inclination angle and passed through the penetrating portion 42 from adhering to the organic EL substrate 92 by decreasing the angle θ2, and accordingly, it is possible to prevent the deposition material 98 from adhering to a portion outside a portion of the organic EL substrate 92 overlapping with the penetrating portion 42. That is, the decrease of the angle θ2 leads to suppression of variations in the area and thickness of the deposition material 98 adhering to the organic EL substrate 92. From this viewpoint, for example, the through-hole 25 is formed such that the angle θ2 is 45 degrees or smaller. Incidentally, FIG. 8 illustrates an example in which a dimension of the first concave portion 30 in the first surface 21a, that is, an opening dimension of the through-hole 25 in the first surface 21a is larger than a dimension r2 of the first concave portion 30 in the connecting portion 41. That is, an example in which a value of the angle θ2 is a positive value is illustrated. However, the dimension r2 of the first concave portion 30 in the connecting portion 41 may be larger than the dimension of the first concave portion 30 in the first surface 21a although not illustrated. That is, the value of the angle θ2 may be a negative value.

Next, a method of manufacturing the deposition mask 20 by the etching process will be described.

(Method of Manufacturing Metal Plate)

First, a method of manufacturing a metal plate used to manufacture the deposition mask will be described.

(Rolling Step)

Figure 9:
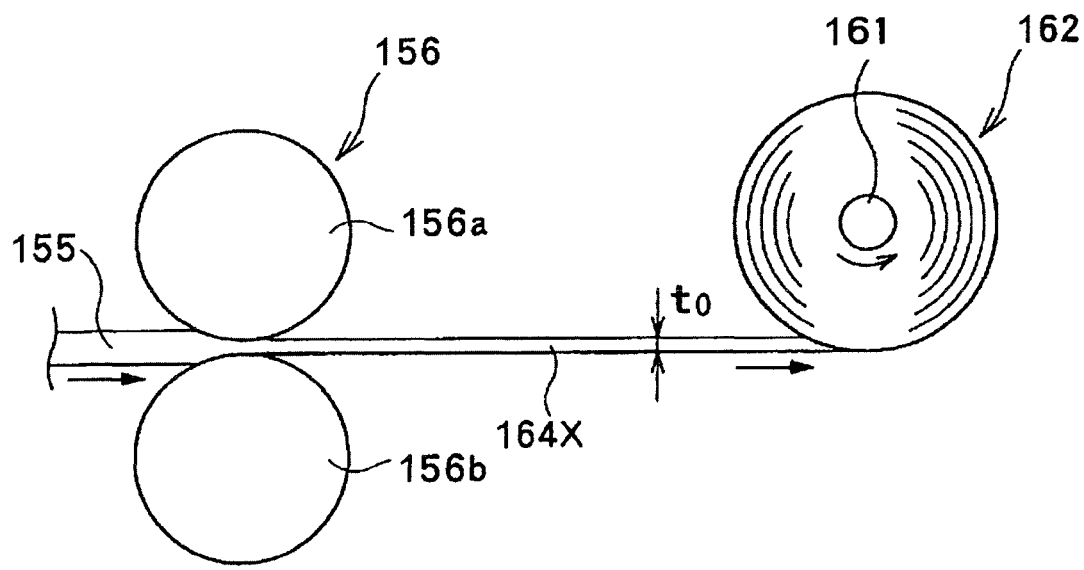
FIG. 9 is a view illustrating a step of rolling a base material to obtain a metal plate having a desired thickness.

First, the base material 155 made of an iron alloy containing nickel is prepared, and this base material 155 is conveyed toward a rolling device 156 including a pair of rolling rolls 156a and 156b along a direction indicated by an arrow as illustrated in FIG. 9. The base material 155 that has reached between the pair of the rolling rolls 156a and 156b is rolled by the pair of rolling rolls 156a and 156b, and as a result, the base material 155 is reduced in thickness and stretched along the conveying direction. As a result, a plate material 164X having a thickness to can be obtained. As illustrated in FIG. 9, a winding body 162 may be formed by winding the plate material 164X around a core 161. A specific value of the thickness to is preferably 5 μm to 85 μm as described above.

Incidentally, FIG. 9 illustrates only an outline of the rolling step, and specific configuration and procedure for carrying out the rolling step are not particularly limited. For example, the rolling step may include a hot rolling step of processing a base material at a temperature equal to or higher than a temperature at which a crystal array of an invar material forming the base material 155 is changed and a cold rolling step of processing a base material at a temperature equal to or lower than the temperature at which the crystal array of the invar material is changed. In addition, a direction in which the base material 155 or the plate material 164X passes between the pair of rolling rolls 156a and 156b is not limited to one direction. For example, the base material 155 or the plate material 164X may be gradually rolled by repeatedly causing the base material 155 or the plate material 164X to pass between the pair of rolling rolls 156a and 156b in a direction from the left side to the right side of the paper plane and from the right side to the left side of the paper plane in FIGS. 9 and 10.

[Slitting Step]

Thereafter, a slitting step may be executed to cut off both ends of the plate material 164X obtained in the rolling step in the width direction over a predetermined range such that a width of the plate material 164X falls within a predetermined range. This slitting step is executed in order to remove a crack that may occur at both the ends of the plate material 164X due to rolling. As such a slitting step is executed, it is possible to prevent a phenomenon that the plate material 164X breaks, that is, generation of a so-called plate breakage due to the crack as a starting point.

[Annealing Step]

Figure 10:
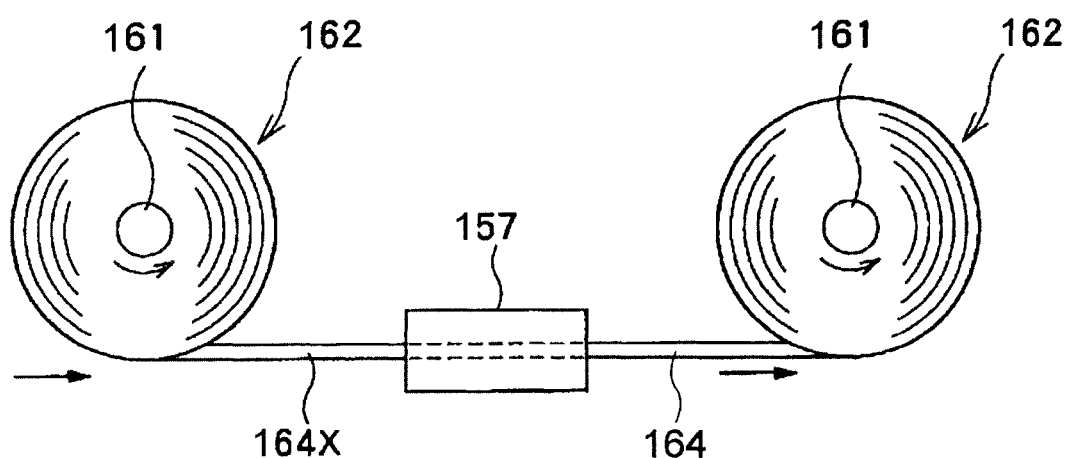
FIG. 10 is a view illustrating a step of annealing the metal plate obtained by rolling.

Thereafter, the plate material 164X is annealed using an annealing device 157 in order to remove residual stress (internal stress) accumulated in the plate material 164X by rolling, thereby obtaining the long metal plate 164 as illustrated in FIG. 10. As illustrated in FIG. 10, the annealing step may be executed while pulling the plate material 164X or the long metal plate 164 in the conveying direction (longitudinal direction). That is, the annealing step may be executed not as so-called batch-type annealing but as continuous annealing while performing conveyance.

Preferably, the annealing step is performed in a non-reducing atmosphere or an inert gas atmosphere. Here, the non-reducing atmosphere is an atmosphere not containing a reducing gas such as hydrogen. "Not containing a reducing gas" means that a concentration of the reducing gas such as hydrogen is 4% or less. The inert gas atmosphere is an atmosphere in which 90% or more of an inert gas such as an argon gas, a helium gas, and a nitrogen gas is present. As the annealing step is executed in the non-reducing atmosphere or the inert gas atmosphere, it is possible to suppress generation of nickel hydroxide on the first surface 164a or the second surface 164b of the long metal plate 164.

Since the annealing step is executed, it is possible to obtain the long metal plate 164 having the thickness $t_0$ from which residual strain has been removed to some extent. The thickness $t_0$ is usually equal to the thickness T0 of the deposition mask 20.

The long metal plate 164 having the thickness $t_0$ may be produced by repeating the above-described rolling step, slitting step, and annealing step a plurality of times. In addition, FIG. 10 illustrates the example in which the annealing step is performed while pulling the long metal plate 164 in the longitudinal direction, but it is not limited thereto, and the annealing step may be executed in a state where the long metal plate 164 is wound around the core 161. That is, the batch-type annealing may be executed. In the case where the annealing step is executed in the state where the long metal plate 164 is wound around the core 161, there is a case where the long metal plate 164 is subject to warpage according to a winding diameter of the winding body 162. Therefore, it is advantageous to execute the annealing step while pulling the long metal plate 164 in the longitudinal direction depending on a winding diameter of the winding body or and a material forming the base material 155 of the winding body 162.

[Cutting Step]

Thereafter, each of both ends of the long metal plate 164 in the width direction is cut off over a predetermined range, thereby performing a cutting step of adjusting a width of the long metal plate 164 to a desired width. In this manner, the long metal plate 164 having a desired thickness and width can be obtained.

(Method of Manufacturing Deposition Mask)

Next, a method of manufacturing the deposition mask 20 using the long metal plate 164 will be described mainly with reference to FIGS. 11 to 19. In the method of manufacturing the deposition mask 20 to be described hereinafter, the long metal plate 164 is supplied, the through-hole 25 is formed in the long metal plate 164, and the long metal plate 164 is cut, thereby obtaining the deposition mask 20 made of the sheet-like metal plate 21 as illustrated in FIG. 11.

More specifically, the method of manufacturing the deposition mask 20 include: a step of supplying the long metal plate 164 extending in a band shape; a step of performing etching on the long metal plate 164 using a photolithography technique to form the first concave portion 30 from the first surface 164a side in the long metal plate 164, and a step of performing etching on the long metal plate 164 using a photolithography technique to form the second concave portion 35 in the long metal plate 164 from the second surface 164b side. Further, the first concave portion 30 and the second concave portion 35 formed in the long metal plate 164 communicate with each other, thereby producing the through-hole 25 in the long metal plate 164. In the examples illustrated in FIGS. 12 to 19, the step of forming the first concave portion 30 is performed before the step of forming the second concave portion 35, and a step of sealing the produced first concave portion 30 is further provided between the step of forming the first concave portion 30 and the step of forming the second concave portion 35. Details of each step will be described hereinafter.

Figure 11:
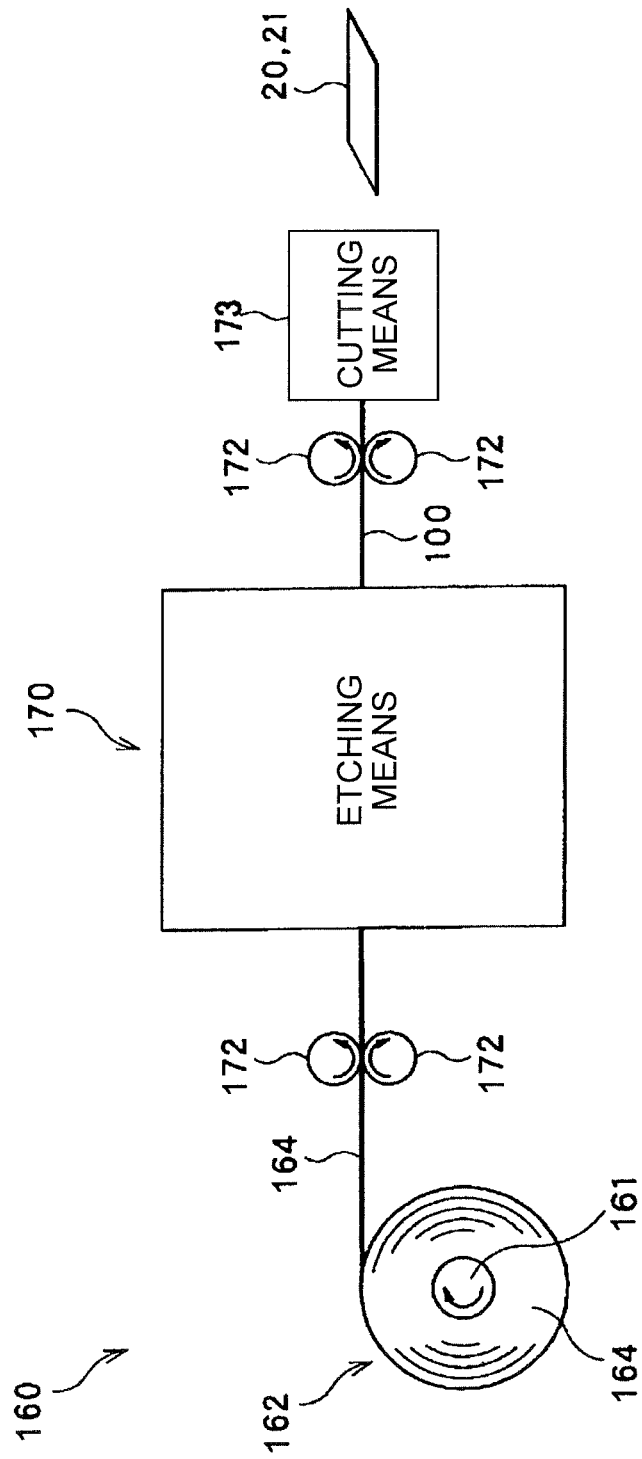
FIG. 11 is a schematic view for describing an example of a method of manufacturing a deposition mask as a whole.

In FIG. 11, a manufacturing device 160 configured to produce the deposition mask 20 is illustrated. First, a winding body 162 obtained by winding the long metal plate 164 around the core 161 is prepared as illustrated in FIG. 11. Then, as the core 161 rotates and the winding body 162 is unwound, the long metal plate 164 extending in the band shape is supplied as illustrated in FIG. 11. Incidentally, the long metal plate 164 is formed with the through-hole 25 to form the sheet-like metal plate 21, and further, the deposition mask 20.

The supplied long metal plate 164 is conveyed to an etching device (etching means) 170 by a conveying roller 172. Each process illustrated in FIGS. 12 to 19 is performed by the etching means 170. Incidentally, it is assumed that the plurality of deposition masks 20 is allocated in the width direction of the long metal plate 164 in the present embodiment. That is, the plurality of deposition masks 20 is produced from regions occupying predetermined positions of the long metal plate 164 in the longitudinal direction. In this case, the plurality of deposition masks 20 is allocated to the long metal plate 164 preferably such that the longitudinal direction of the deposition mask 20 coincides with a rolling direction of the long metal plate 164.

Figure 12:
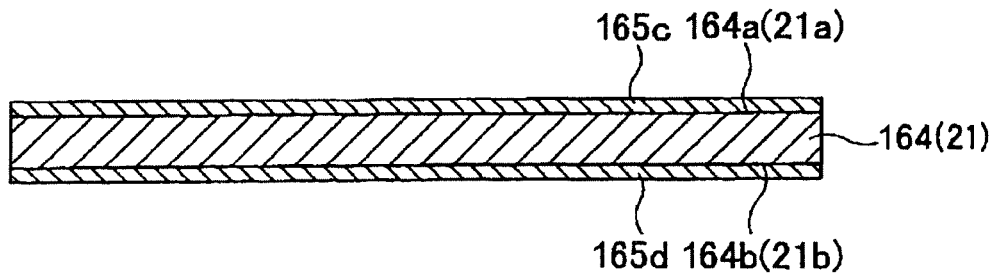
FIG. 12 is a view illustrating a step of forming a resist film on the metal plate.

First, resist films 165c and 165d containing a negative photosensitive resist material are formed on the first surface 164a and the second surface 164b of the long metal plate 164 as illustrated in FIG. 12. A method of pasting a film formed with a layer containing a photosensitive resist material such as an acrylic photocurable resin, that is, a so-called dry film on the first surface 164a and the second surface 164b of the long metal plate 164 is adopted as a method of forming the resist films 165c and 165d.

Figure 13:
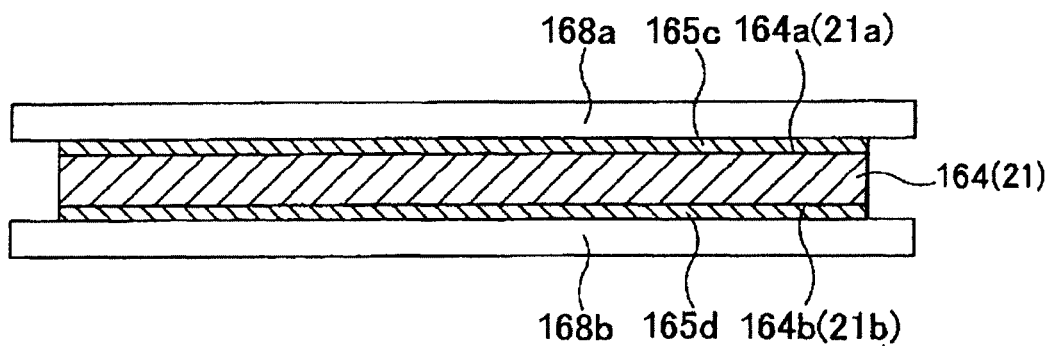
FIG. 13 is a view illustrating a step of bringing an exposure mask into close contact with the resist film.

Next, exposure masks 168a and 168b which allow light to pass through regions that are desirably removed in the resist films 165c and 165d are prepared, and the exposure masks 168a and 168b are arranged on the resist films 165c and 165d, respectively, as illustrated in FIG. 13. For example, a glass dry plate which does not allow light to pass through the regions that are desirably removed in the resist films 165c and 165d is used as the exposure masks 168a and 168b. Thereafter, the exposure masks 168a and 168b are sufficiently brought into close contact with the resist films 165c and 165d by vacuum adhesion. Incidentally, a positive material may be used as photosensitive resist material. In this case, an exposure mask configured to allow light to pass through a region that is desirably removed out of the resist film is used as the exposure mask.

Figure 14:
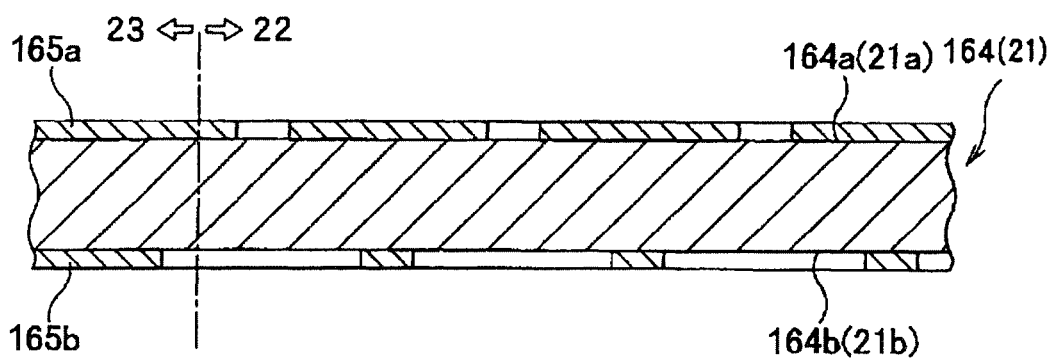
FIG. 14 is a view illustrating a step of developing the resist film.

Thereafter, the resist films 165c and 165d are exposed to light through the exposure masks 168a and 168b (an exposure step). Further, the resist films 165c and 165d are developed to form images on the exposed resist films 165c and 165d (a developing step). As described above, it is possible to form the first resist pattern 165a on the first surface 164a of the long metal plate 164 and the second resist pattern 165b on the second surface 164b of the long metal plate 164 as illustrated in FIG. 14. Incidentally, the developing step may include a resist heat treatment step for enhancing each hardness of the resist films 165c and 165d or more strongly bringing the resist films 165c and 165d to be close contact with the long metal plate 164. The resist heat treatment step is executed in an atmosphere of an inert gas such as an argon gas, a helium gas, and a nitrogen gas at, for example, 100° C. to 400° C.

Figure 15:
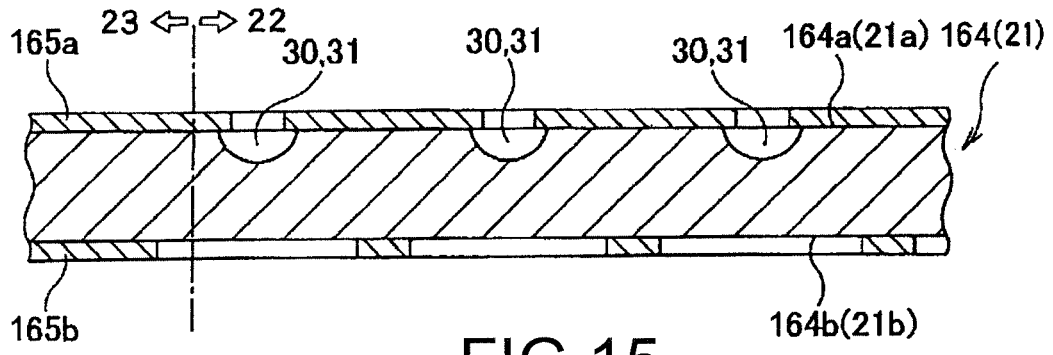
FIG. 15 is a view illustrating a first surface etching step.

Next, a first surface etching step of etching a region of the first surface 164a of the long metal plate 164 that is not covered with the first resist pattern 165a by using a first etching solution is performed as illustrated in FIG. 15. For example, the first etching solution is sprayed from a nozzle arranged on a side opposing the first surface 164a of the conveyed long metal plate 164 toward the first surface 164a of the long metal plate 164 through the first resist pattern 165a. As a result, erosion by the first etching solution proceeds in the region of the long metal plate 164 that is not covered with the first resist pattern 165a as illustrated in FIG. 15. As a result, a large number of the first concave portions 30 are formed in the first surface 164a of the long metal plate 164. For example, a solution containing a ferric chloride solution and hydrochloric acid is used as the first etching solution.

Figure 16:
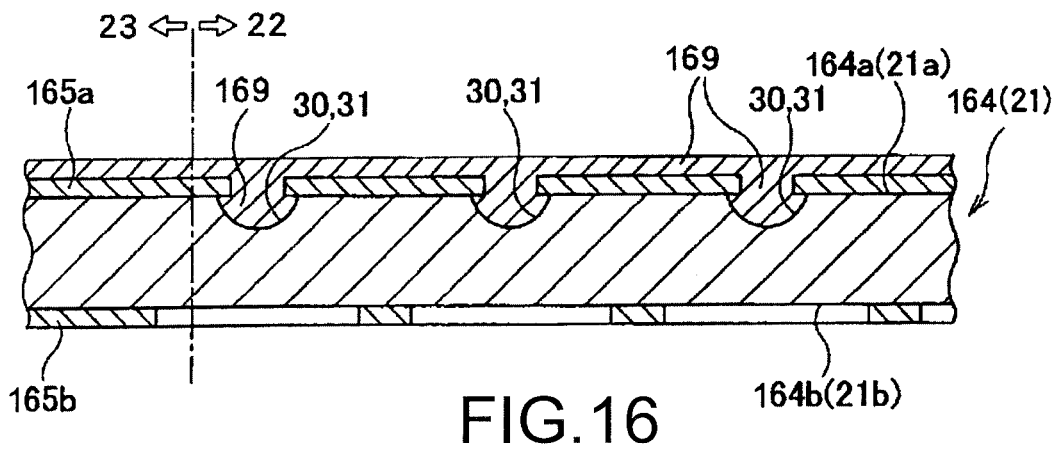
FIG. 16 is a view illustrating a step of coating a first concave portion with resin.

Thereafter, the first concave portion 30 is covered with a resin 169 having resistance against a second etching solution to be used in a subsequent second surface etching step as illustrated in FIG. 16. That is, the first concave portion 30 is sealed by the resin 169 having resistance against the second etching solution. In the example illustrated in FIG. 16, a film of the resin 169 is formed so as to cover not only the formed first concave portion 30 but also the first surface 164a (the first resist pattern 165a).

Figure 17:
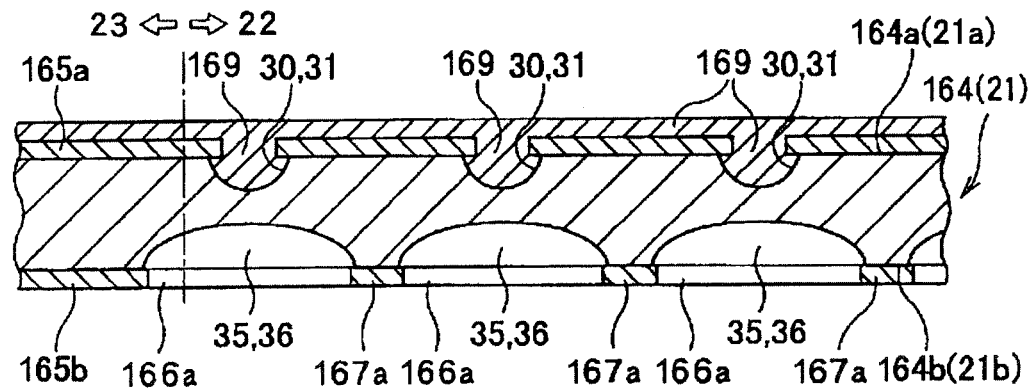
FIG. 17 is a view illustrating a second surface etching step.

Next, the second surface etching step of etching a region of the second surface 164b of the long metal plate 164 that is not covered with the second resist pattern 165b to form the second concave portion 35 on the second surface 164b is performed as illustrated in FIG. 17. The second surface etching step is performed until the first concave portion 30 and the second concave portion 35 communicate with each other to form the through-hole 25. For example, a solution containing a ferric chloride solution and hydrochloric acid is used as the second etching solution, which is similar to the above-described first etching solution.

Figure 18:
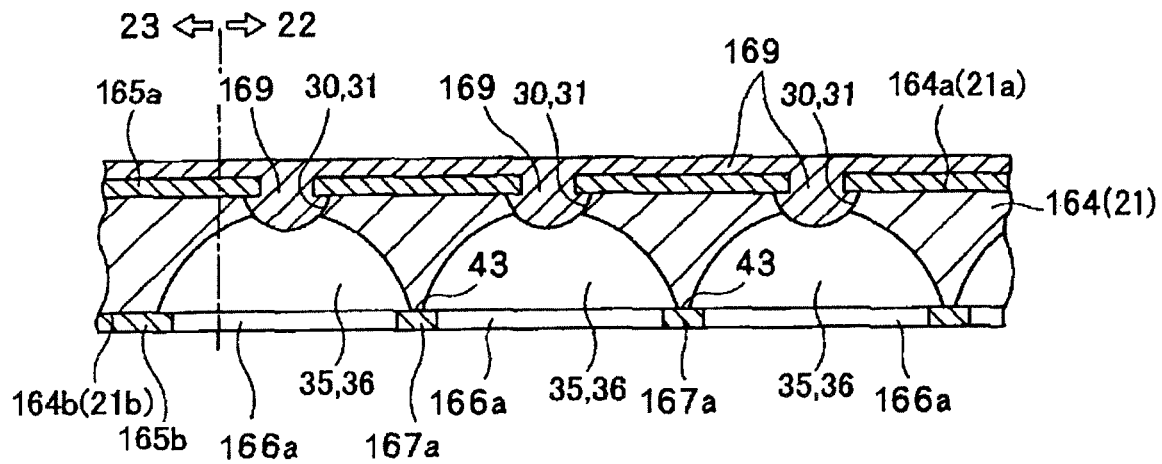
FIG. 18 is a view illustrating the second surface etching step subsequent to FIG. 18.

Incidentally, the erosion by the second etching solution is performed in a portion of the long metal plate 164 which is in contact with the second etching solution. Therefore, the erosion proceeds not only in the normal direction N (thickness direction) of the long metal plate 164 but also in the direction along the plate plane of the long metal plate 164. Here, the second surface etching step is preferably ended before the two second concave portions 35 respectively formed at positions opposing two adjacent holes 166a of the second resist pattern 165b join each other on the back side of a bridge portion 167a positioned between the two holes 166a. As a result, the above-described top portion 43 can be left on the second surface 164b of the long metal plate 164 as illustrated in FIG. 18.

Figure 19:
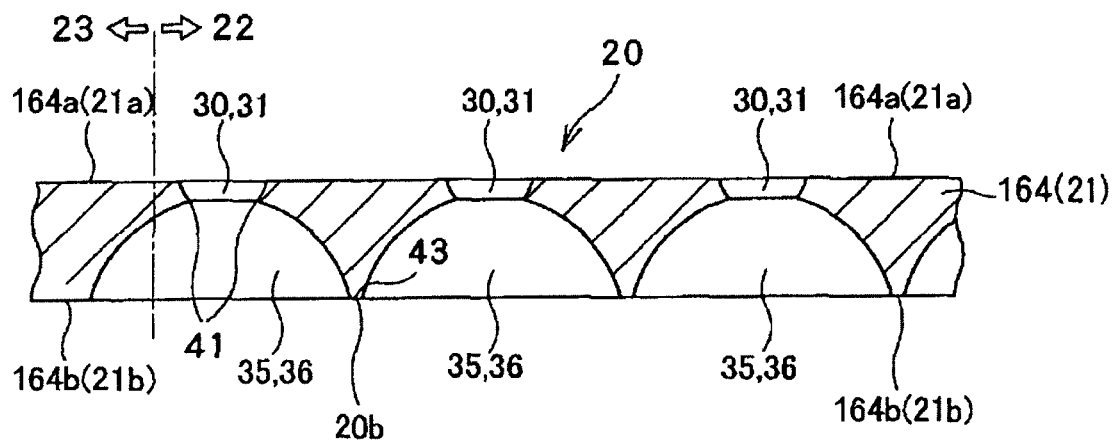
FIG. 19 is a view illustrating a step of removing resin and a resist pattern from a long metal plate.

Thereafter, the resin 169 is removed from the long metal plate 164 as illustrated in FIG. 19. The resin 169 can be removed, for example, by using an alkali-based peeling solution. When the alkali-based peeling solution is used, the resist patterns 165a and 165b can also be removed simultaneously with the resin 169 as illustrated in FIG. 19. Incidentally, the resist patterns 165a and 165b may be removed separately from the resin 169 by using a peeling solution different from the peeling solution for peeling the resin 169 after removing the resin 169.

The long metal plate 164 having a large number of the through-holes 25 formed in this manner is conveyed to a cutting device (cutting means) 173 by conveying rollers 172 and 172 rotating while holding the long metal plate 164. Incidentally, the above-described supplied core 161 is rotated via a tension (tensile stress) acting on the long metal plate 164 due to the rotation of the conveying rollers 172 and 172, and the long metal plate 164 is supplied from the winding body 162.

Thereafter, the long metal plate 164 having a large number of the through-holes 25 formed therein is cut into predetermined length and width by the cutting device (cutting means) 173, thereby obtaining the sheet-like metal plate 21 having a large number of the through-holes 25 formed therein, that is, the deposition mask 20.

(Deposition Mask Manufactured by Plating Process)

Incidentally, the deposition mask 20 can also be manufactured by using a plating process. Therefore, the deposition mask 20 manufactured by the plating process will be described hereinafter. First, shapes of the through-hole 25 and a peripheral part thereof when the deposition mask 20 is formed by the plating process will be described.

Figure 20:
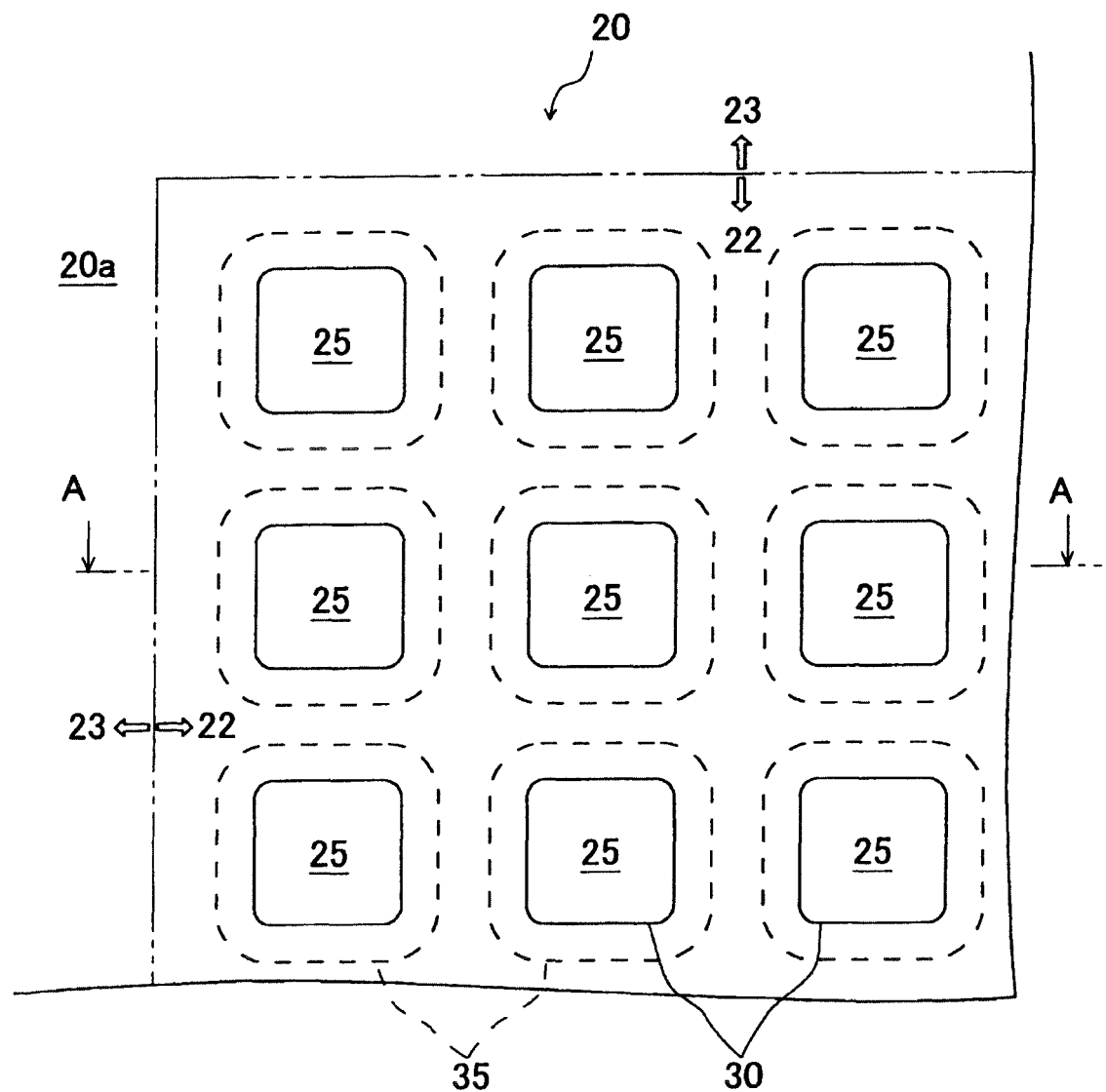
FIG. 20 is an enlarged plan view illustrating the effective region of the deposition mask.
Figure 21:
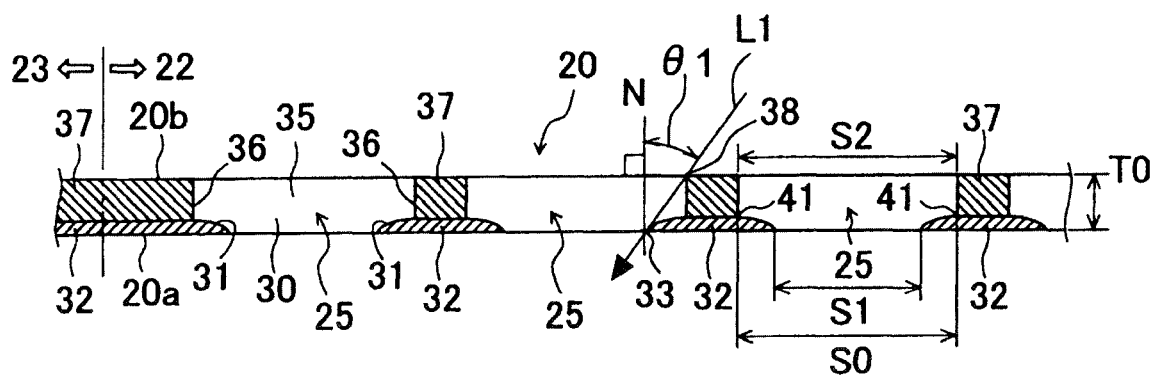
FIG. 21 is a cross-sectional view of the effective region of FIG. 20 as viewed from the A-A direction.

FIG. 20 is an enlarged plan view illustrating the effective region 22 from the second surface 20b side of the deposition mask 20 manufactured by the plating process. As illustrated in FIG. 4, the plurality of through-holes 25 formed in each of the effective regions 22 are arrayed at predetermined pitches along the two directions orthogonal to each other in the effective region 22 in the illustrated example. An example of the through-hole 25 will be described in more detail mainly with reference to FIG. 21. FIG. 21 is a cross-sectional view of the effective region 22 in FIG. 20 as viewed from the A-A direction.

As illustrated in FIG. 21, the deposition mask 20 includes a first metal layer 32 forming the first surface 20a, a second metal layer 37 provided on the first metal layer 32 and forming the second surface 20b. When the deposition material 98 is deposited on the organic EL substrate 92 (during deposition), the second metal layer 37 is arranged on the side of the above-described frame 15 (see FIG. 1 and the like). The first metal layer 32 is provided with the first opening 30 in a predetermined pattern, and the second metal layer 37 is provided with the second opening 35 in a predetermined pattern. The first opening 30 and the second opening 35 communicate with each other to form the through-hole 25 extending from the first surface 20a to the second surface 20b of the deposition mask 20.

As illustrated in FIG. 20, the first opening 30 and the second opening 35 forming the through-hole 25 may have a substantially polygonal shape in a plan view. Here, an example in which the first opening 30 and the second opening 35 are formed in a substantially quadrangular shape, more specifically, a substantially square shape is illustrated. Although not illustrated, the first opening 30 and the second opening 35 may have other substantially polygonal shapes such as a substantially hexagonal shape and a substantially octagonal shape. Incidentally, the "substantially polygonal shape" is a concept including a shape in which corners of a polygon are rounded. Although not illustrated, the first opening 30 and the second opening 35 may have a circular shape. In addition, a shape of the first opening 30 and a shape of the second opening 35 are not necessarily formed in similar shapes as long as the second opening 35 has the outline that surrounds the first opening 30 in a plan view.

In FIG. 21, the reference sign 41 represents the connecting portion at which the first metal layer 32 and the second metal layer 37 are connected. In addition, the reference sign S0 represents a dimension of the through-hole 25 in the connecting portion 41 between the first metal layer 32 and the second metal layer 37. Incidentally, FIG. 21 illustrates an example in which the first metal layer 32 and the second metal layer 37 are in contact with each other, but it is not limited thereto, and another layer may be interposed between the first metal layer 32 and the second metal layer 37. For example, a catalyst layer, configured to promote precipitation of the second metal layer 37 on the first metal layer 32, may be provided between the first metal layer 32 and the second metal layer 37.

Figure 22:
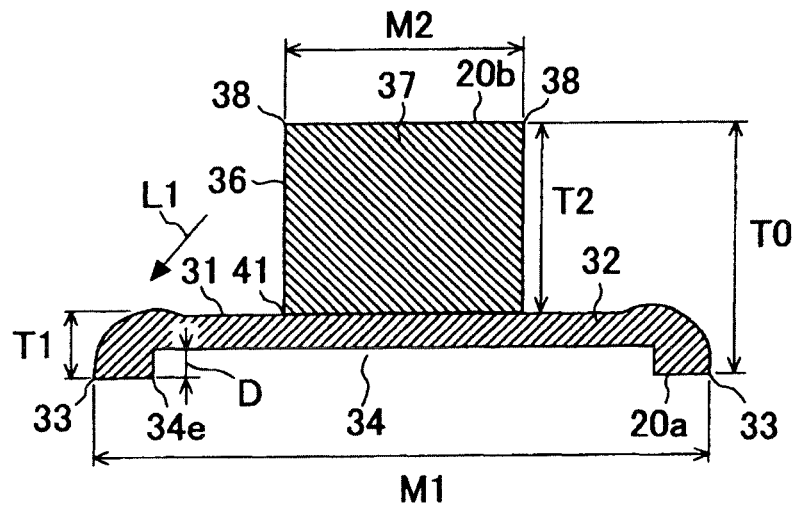
FIG. 22 is a partially enlarged cross-sectional view of the deposition mask of FIG. 21.

FIG. 22 is a view illustrating each part of the first metal layer 32 and the second metal layer 37 of FIG. 21 in an enlarged manner. As illustrated in FIG. 22, a width M2 of the second metal layer 37 on the second surface 20b of the deposition mask 20 is smaller than a width M1 of the first metal layer 32 on the first surface 20a of the deposition mask 20. In other words, the opening dimension S2 of the through-hole 25 (the second opening 35) on the second surface 20b is larger than the opening dimension S1 of the through-hole 25 (the first opening 30) on the first surface 20a. Hereinafter, advantages obtained by forming the first metal layer 32 and the second metal layer 37 in this manner will be described.

The deposition material 98 flying from the second surface 20b side of the deposition mask 20 sequentially passes through the second opening 35 and the first opening 30 of the through-hole 25 and adheres to the organic EL substrate 92. A region of the organic EL substrate 92 to which the deposition material 98 adheres is mainly determined by the opening dimension S1 and an opening shape of the through-hole 25 on the first surface 20a. Meanwhile, the deposition material 98 not only moves along a normal direction N of the deposition mask 20 from the crucible 94 toward the organic EL substrate 92 but also moves in a direction which is greatly inclined with respect to the normal direction N of the deposition mask 20 as illustrated by an arrow L1 directed from the second surface 20b side to the first surface 20a in FIGS. 21 and 22. Here, if the opening dimension S2 of the through-hole 25 on the second surface 20b is the same as the opening dimension S1 of the through-hole 25 on the first surface 20a, most of the deposition material 98 moving in the direction that is greatly inclined with respect to the normal direction N of the deposition mask 20 adheres to the second surface 20b of the deposition mask 20 (upper surface of the second metal layer 37 in FIG. 21) and reaches and adheres to the wall surface 36 of the second opening 35 of the through-hole 25 before passing through the through-hole 25 and reaching the organic EL substrate 92. Thus, the amount of the deposition material 98 that hardly passes through the through-hole 25 increases. Therefore, it can be said that it is preferable to increase the opening dimension S2 of the second opening 35, that is, to reduce the width M2 of the second metal layer 37 in order to enhance the utilization efficiency of the deposition material 98.

In FIG. 21, a minimum angle formed by the straight line L1 in contact with the wall surface 36 of the second metal layer 37 and the wall surface 31 of the first metal layer 32 with respect to the normal direction N of the deposition mask 20 is represented by a reference sign 81. It is advantageous to increase the angle θ1 in order to allow the deposition material 98 moving obliquely to reach the organic EL substrate 92 as much as possible. For example, it is preferable to set the angle θ1 at 45° or larger.

Upon increasing the angle θ1, it is advantageous to set the width M2 of the second metal layer 37 to be smaller than the width M1 of the first metal layer 32. As apparent from the drawing, it is advantageous to reduce a thickness T1 of the first metal layer 32 and a thickness T2 of the second metal layer 37 upon increasing the angle θ1. Incidentally, it is considered that the strength of the deposition mask 20 decreases when the width M2 of the second metal layer 37, the thickness T1 of the first metal layer 32, and the thickness T2 of the second metal layer 37 are excessively reduced, and thus, the deposition mask 20 is damaged during conveyance or use. For example, it is considered that the deposition mask 20 is damaged by tensile stress applied to the deposition mask 20 when the deposition mask 20 is stretched to be installed to the frame 15. When considering these points, it can be said that it is preferable to set dimensions of the first metal layer 32 and the second metal layer 37 within the following ranges. As a result, the above-described angle 81 can be set to, for example, 45° or larger.

The width M1 of the first metal layer 32: 5 μm to 25 μm
The width M2 of the second metal layer 37: 2 μm to 20 μm
The thickness T0 of the deposition mask 20: 3 μm to 50 μm, more preferably 3 μm to 50 μm, still more preferably 3 μm to 30 μm, and even still more preferably 3 μm to 25 μm
The thickness T1 of the first metal layer 32: 5 μm or less
The thickness T2 of the second metal layer 37: 2 μm to 50 μm, more preferably 3 μm to 50 μm, still more preferably 3 μm to 30 μm, and even still more preferably 3 μm to 25 μm In the present embodiment, the thickness T0 of the deposition mask 20 is the same in the effective region 22 and the peripheral region 23.

The above opening dimensions S0, S1, and S2 are appropriately set in consideration of the pixel density of the organic EL display device, desired values of the above angle 81, and the like. For example, in the case of manufacturing an organic EL display device having a pixel density of 400 ppi or more, the opening dimension S0 of the through-hole 25 in the connecting portion 41 can be set to 15 μm to 60 μm. In addition, the opening dimension S1 of the first opening 30 on the first surface 20a is set to 10 μm to 50 μm, and the opening dimension S2 of the second opening 35 on the second surface 20b is set to 15 μm to 60 μm.

As illustrated in FIG. 22, a recessed portion 34 may be formed on the first surface 20a of the deposition mask 20 formed of the first metal layer 32. The recessed portion 34 is formed so as to correspond to a conductive pattern 52 of a pattern substrate 50 to be described later when manufacturing the deposition mask 20 by the plating process. A depth D of the recessed portion 34 is, for example, 50 nm to 500 nm. Preferably, an outer edge 34e of the recessed portion 34 formed in the first metal layer 32 is positioned between the end 33 of the first metal layer 32 and the connecting portion 41.

Next, an example of manufacturing the deposition mask 20 by the plating process will be described.

(Method of Manufacturing Deposition Mask)

FIGS. 23 to 26 are views for describing the method of manufacturing the deposition mask 20.

[Pattern Substrate Preparation Step]

Figure 23:
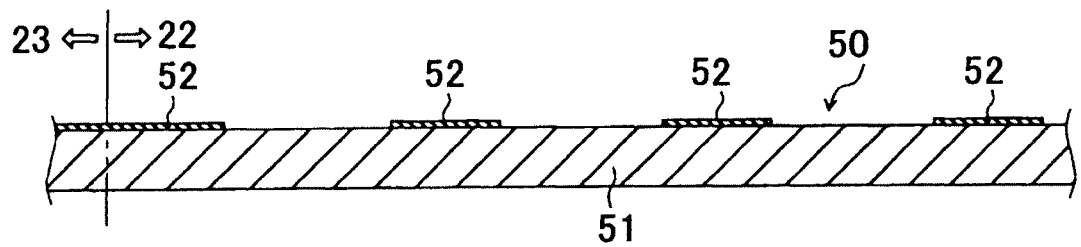
FIG. 23 is a view for describing an example of a deposition mask manufacturing method according to a present embodiment.

First, the pattern substrate 50 illustrated in FIG. 23 is prepared. The pattern substrate 50 has a base material 51 having insulating properties and a conductive pattern 52 formed on the base material 51. The conductive pattern 52 has a pattern corresponding to the first metal layer 32. Incidentally, the pattern substrate 50 may be subjected to a releasing process in order to facilitate a separation step, which will be described later, of separating the deposition mask 20 from the pattern substrate 50.

[First Plating Process Step]

Next, a first plating process step of supplying a first plating solution onto the base material 51 on which the conductive pattern 52 has been formed to precipitate the first metal layer 32 on the conductive pattern 52 is performed. For example, the base material 51 on which the conductive pattern 52 has been formed is immersed in a plating tank filled with the first plating solution. As a result, the first metal layer 32 provided with the first openings 30 in the predetermined pattern can be obtained on the pattern substrate 50 as illustrated in FIG. 24.

Figure 24:
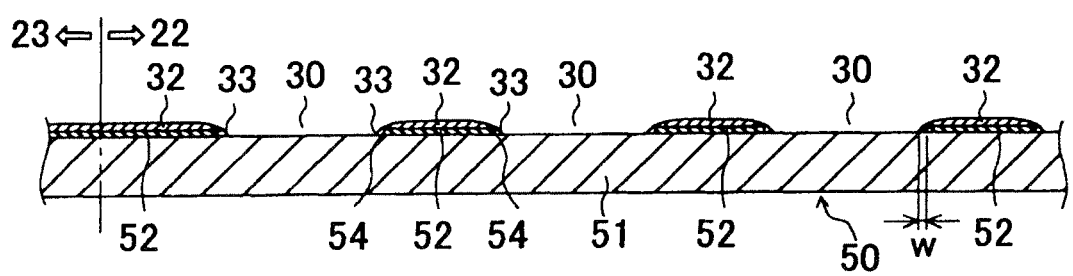
FIG. 24 is a view for describing an example of the deposition mask manufacturing method according to the present embodiment.

Incidentally, the first metal layer 32 can be formed not only in a portion overlapping with the conductive pattern 52 when viewed along the normal direction of the base material 51 but also in a portion that does not overlap with the conductive pattern 52 as illustrated in FIG. 24 in terms of characteristics of the plating process. This is because the first metal layer 32 is further precipitated on the surface of the first metal layer 32 which has been precipitated on the portion overlapping with an end 54 of the conductive pattern 52. As a result, the end 33 of the first opening 30 can be positioned in a portion that does not overlap with the conductive pattern 52 when viewed along the normal direction of the base material 51 as illustrated in FIG. 24. In addition, the above recessed portion 34 corresponding to the thickness of the conductive pattern 52 is formed on a surface of the first metal layer 32 on the side in contact with the conductive pattern 52.

A specific method of the first plating process step is not particularly limited as long as the first metal layer 32 can be precipitated on the conductive pattern 52 For example, the first plating process step may be performed as a so-called electrolytic plating process step of causing an electric current to flow through the conductive pattern 52 to precipitate the first metal layer 32 on the conductive pattern 52. Alternatively, the first plating process step may be an electroless plating process step.

Components of the first plating solution to be used are appropriately determined depending on characteristics required for the first metal layer 32. For example, when the first metal layer 32 is made of an iron alloy containing nickel, a mixed solution of a solution containing a nickel compound and a solution containing an iron compound can be used as the first plating solution. For example, a mixed solution of a solution containing nickel sulfamate or nickel bromide and a solution containing ferrous sulfamate can be used. The plating solution may contain various additives. As the additives, a pH buffer such as boric acid, a primary brightener such as saccharin sodium, a secondary brightener such as butynediol, propargyl alcohol, coumarin, formalin, and thiourea, an antioxidant, a stress relaxation agent, and the like can be used. Among them, the primary brightener may contain a sulfur component.

[Resist Formation Step]

Figure 25:
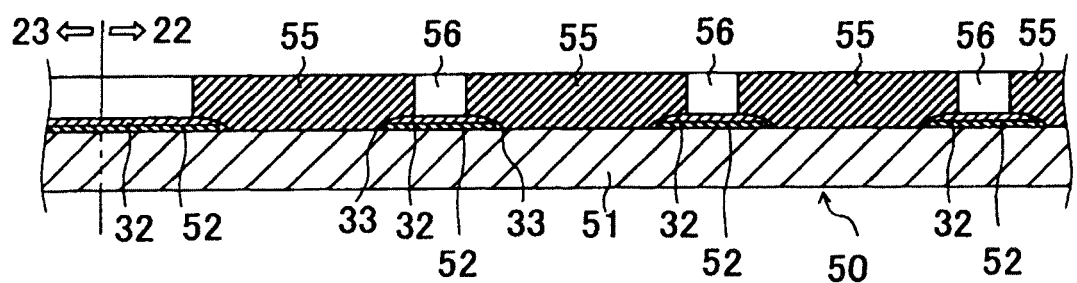
FIG. 25 is a view for describing an example of the deposition mask manufacturing method according to the present embodiment.

Next, a resist formation step is performed on the base material 51 and the first metal layer 32 to form a resist pattern 55 with a predetermined gap 56 therebetween. As illustrated in FIG. 25, the resist formation step is performed such that the first opening 30 of the first metal layer 32 is covered with the resist pattern 55 and the gap 56 of the resist pattern 55 is positioned on the first metal layer 32.

[Second Plating Process Step]

Figure 26:
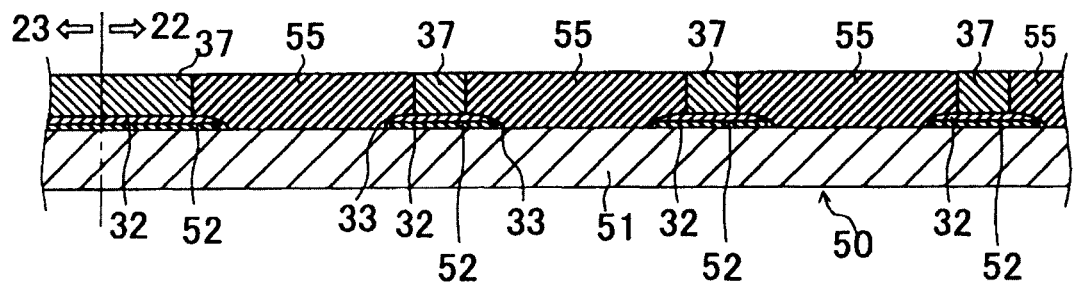
FIG. 26 is a view for describing an example of the deposition mask manufacturing method according to the present embodiment.

Next, a second plating process step of supplying a second plating solution to the gap 56 of the resist pattern 55 to precipitate the second metal layer 37 on the first metal layer 32 is performed. For example, the base material 51 on which the first metal layer 32 has been formed is immersed in a plating tank filled with the second plating solution. As a result, the second metal layer 37 can be formed on the first metal layer 32 as illustrated in FIG. 26.

A specific method of the second plating process step is not particularly limited as long as the second metal layer 37 can be precipitated on the first metal layer 32. For example, the second plating process step may be performed as a so-called electrolytic plating process step of causing an electric current to flow through the first metal layer 32 to precipitate the second metal layer 37 on the first metal layer 32. Alternatively, the second plating process step may be an electroless plating process step.

A plating solution which is the same as the above-described first plating solution may be used as the second plating solution. Alternatively, a plating solution different from the first plating solution may be used as the second plating solution. When the composition of the first plating solution and the composition of the second plating solution are the same, the composition of metal forming the first metal layer 32 and the composition of metal forming the second metal layer 37 also become the same.

[Resist Removal Step]

Thereafter, a resist removal step of removing the resist pattern 55 is performed. For example, the resist pattern 55 can be peeled off from the base material 51, the first metal layer 32, and the second metal layer 37 by using an alkali-based peeling solution.

[Separation Step]

Next, the separation step of separating a combined body of the first metal layer 32 and the second metal layer 37 from the base material 51 is performed. Since an organic film formed by the above-described releasing process has been formed on the conductive pattern 52 when the combined body is separated from the base material 51, the first metal layer 32 of the combined body is peeled off from a surface of the organic film, and the conductive pattern 52 remains on the base material 51 together with the organic film. As a result, it is possible to obtain the deposition mask 20 that includes the first metal layer 32 provided with the first openings 30 in the predetermined pattern and the second metal layer 37 provided with the second openings 35 communicating with the first openings 30.

In the above description, the example in which the deposition mask 20 formed by the plating process is constituted by the first metal layer 32 and the second metal layer 37 has been described. However, it is not limited thereto, and the deposition mask 20 formed by the plating process may be constituted by a single metal layer (not illustrated).

[Method of Manufacturing Deposition Mask Device]

Next, a method of manufacturing the deposition mask device 10 using the deposition mask 20 obtained as above will be described.

First, a welding process of welding the deposition mask 20 prepared as described above to the frame 15 by the etching process or the plating process is performed. As a result, it is possible to obtain the deposition mask device 10 including the deposition mask 20 and the frame 15. The deposition mask 20 thus obtained is welded to the frame 15 in a stretched state, thereby obtaining the deposition mask device 10 as illustrated in FIG. 3.

(Deposition Mask Package)

Next, a description will be given regarding a deposition mask package packaging the deposition mask 20 obtained by the etching process or the plating process with reference to FIGS. 27 to 41.

Figure 27:
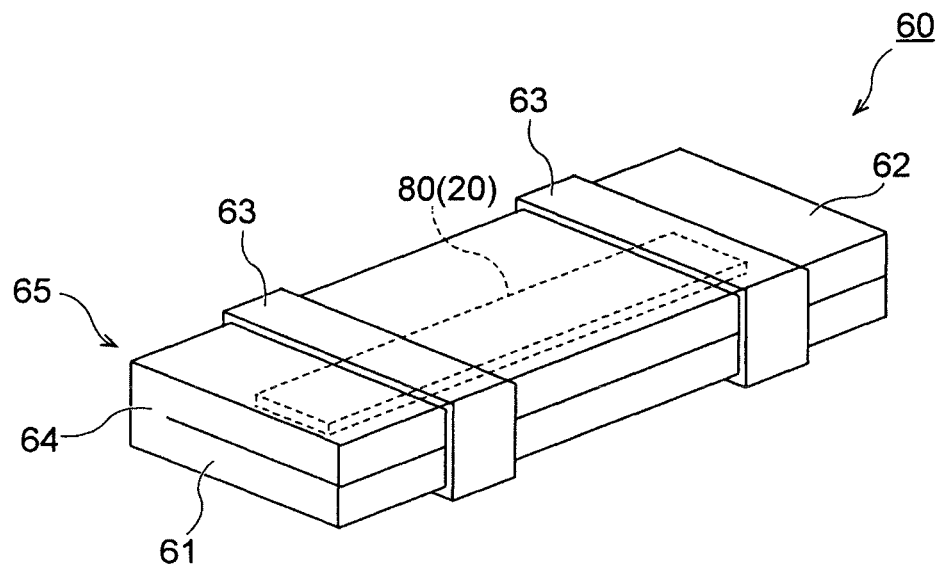
FIG. 27 is a perspective view illustrating a deposition mask package according to a present embodiment.
Figure 28:
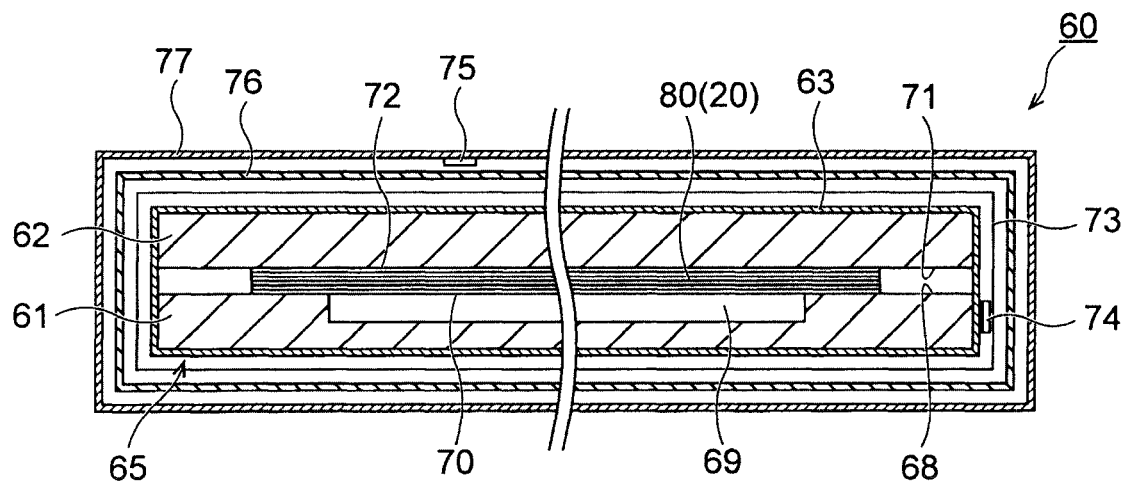
FIG. 28 is a longitudinal cross-sectional view illustrating the deposition mask package of FIG. 27.
Figure 29:
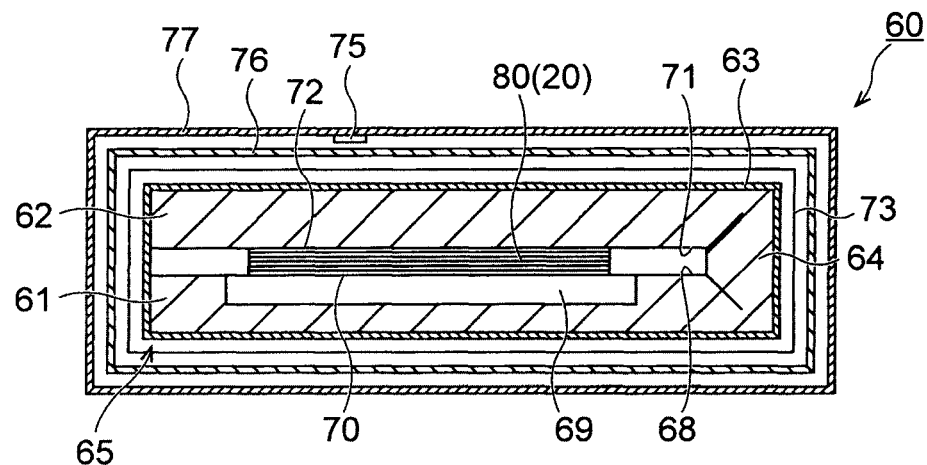
FIG. 29 is a transverse cross-sectional view illustrating the deposition mask package of FIG. 27.

As illustrated in FIGS. 27 to 29, a deposition mask package 60 according to the present embodiment includes a receiving portion 61, a lid portion 62 provided above the receiving portion 61 and face the receiving portion 61, and a deposition mask stacked body 80 arranged between the receiving portion 61 and the lid portion 62. Among them, the deposition mask stacked body 80 includes the deposition masks 20 described above and a plurality of interposed sheets 81 stacked on the deposition mask 20. Details of the deposition mask stacked body 80 will be described later.

The deposition mask stacked body 80 is sandwiched between the receiving portion 61 and the lid portion 62. In the present embodiment, the receiving portion 61 and the lid portion 62 are bound together by elastic belts 63 (binding means), and the receiving portion 61 and the lid portion 62 press and sandwich the deposition mask stacked body 80 by the elastic forces of the elastic belts 63. Although an example in which the receiving portion 61 and the lid portion 62 are bound by the two elastic belts 63 is illustrated here, but the number of the elastic belts 63 is arbitrary as long as it is possible to prevent the receiving portion 61 and the lid portion 62 from being displaced from each other during transportation. In addition, it is not limited to the use of the elastic belt 63 as long as the receiving portion 61 and the lid portion 62 can sandwich the deposition mask stacked body 80.

In the present embodiment, the receiving portion 61 and the lid portion 62 are connected via a hinge portion 64. That is, the receiving portion 61 and the lid portion 62 can be folded via the hinge portion 64, and can be shifted from a developed state illustrated in FIG. 30 to a folded state illustrated in FIGS. 27 to 29. The receiving portion 61 and the lid portion 62 can return to the developed state after unpacking.

Figure 30:
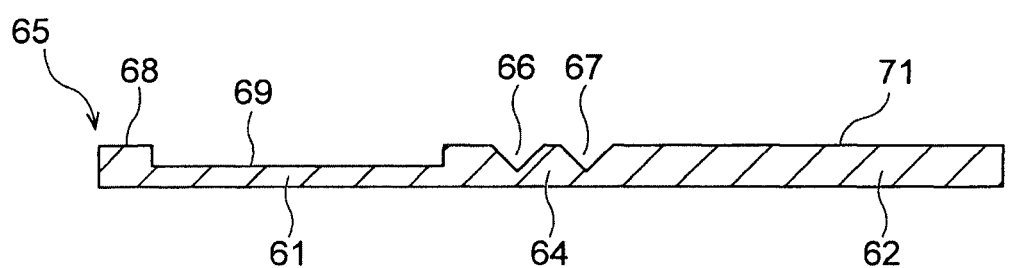
FIG. 30 is a transverse cross-sectional view illustrating a developed state of a packaging member of FIG. 27.

The receiving portion 61, the lid portion 62, and the hinge portion 64 are integrally formed to constitute a double-hinged packaging member 65. FIG. 30 illustrates a traverse cross section of this packaging member 65. Here, a longitudinal cross section means a cross section in the longitudinal direction (first direction) of the deposition mask 20 to be packaged. The traverse cross section means a cross section in the width direction (second direction) orthogonal to the longitudinal direction of the deposition mask 20 to be packaged.

As illustrated in FIG. 30, a V-shaped receiving-portion-side groove 66 is formed between the receiving portion 61 and the hinge portion 64. A V-shaped lid-portion-side groove 67 is formed between the hinge portion 64 and the lid portion 62. When the packaging member 65 is folded into the state illustrated in FIGS. 27 to 29, these grooves 66 and 67 are crushed. That is, a pair of groove wall surfaces defining the grooves 66 and 67 abut on each other so that the packaging member 65 is foldable. When the receiving-portion-side groove 66 and the lid-portion-side groove 67 have an apex angle of 90°, it is possible to make the receiving portion 61 and the lid portion 62 face each other substantially in the folded state of the packaging member 65. An arbitrary material can be used for the packaging member 65 as long as the plastic deformation of the deposition mask 20 during transportation can be prevented. For example, a cardboard made of plastic can be suitably used from the viewpoints of strength and mass.

As illustrated in FIGS. 28 to 32, the receiving portion 61 has a flat first opposing surface 68 facing the lid portion 62 and a concave portion 69 provided in the first opposing surface 68. When the receiving portion 61 has a configuration in which a plurality of material sheets (for example, plastic cardboard sheets) is stacked, an opening may be provided in a sheet on the side of the first opposing surface 68, and no opening may be provided in a sheet on the opposite side of the first opposing surface 68. In this case, it is possible to obtain the concave portion 69 formed on the first opposing surface 68 when viewed as the receiving portion 61. Here, the plastic cardboard sheet includes a pair of liners and a middle core having a corrugated cross section interposed between the liners. In the case of stacking the plurality of cardboard sheets, it is preferable to stack the plurality of cardboard sheets such that extending directions of corrugated ridges (or valleys) of middle cores of cardboard sheets, adjacent to each other, are perpendicular to each other. In this case, it is possible to improve the strength of the receiving portion 61 constituted by the stacked cardboard sheets.

Figure 33:
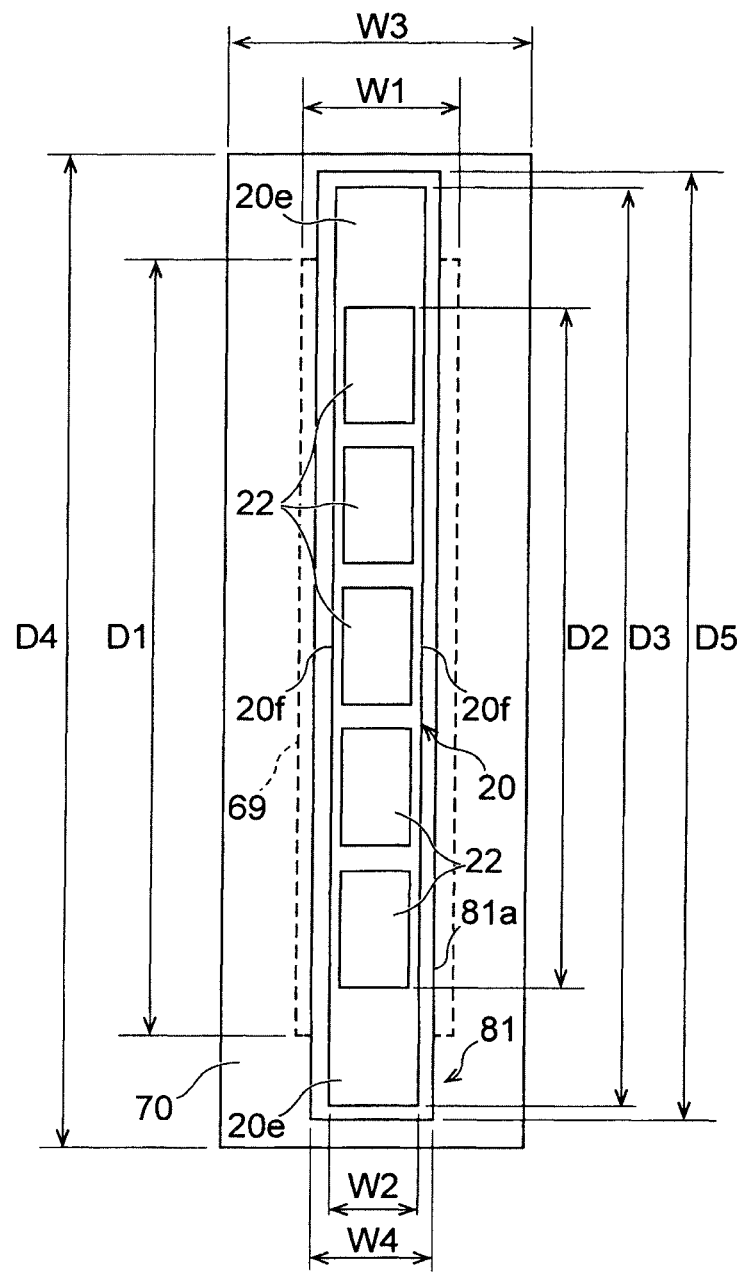
FIG. 33 is a plan view illustrating the deposition mask placed on a receiving portion of FIGS. 28 and 29.

As illustrated in FIG. 33, the concave portion 69 is formed in a rectangular shape so as to have a longitudinal direction when viewed along a stacking direction of the deposition mask 20 (normal direction N of the deposition mask 20). The longitudinal direction of the concave portion 69 extends along the longitudinal direction (first direction) of the deposition mask 20. In other words, the deposition mask 20 is placed on the concave portion 69 so as to have the longitudinal direction along the longitudinal direction of the concave portion 69.

A dimension D1 of the concave portion 69 in the longitudinal direction is larger than a dimension D2 from one end to the other end of the plurality of effective regions 22 in the longitudinal direction of the deposition mask 20. As a result, all the effective region 22 of the deposition mask 20 are arranged on the concave portion 69. However, the dimension D1 of the concave portion 69 in the longitudinal direction is smaller than the overall length (dimension in the longitudinal direction) D3 of the deposition mask 20 in the longitudinal direction. As a result, ends 20e on both sides of the deposition mask 20 in the longitudinal direction are arranged not on the concave portion 69 but on the first opposing surface 68, and are sandwiched between the receiving portion 61 and the lid portion 62. Thus, the deposition mask 20 is prevented from being displaced in the traverse direction between the receiving portion 61 and the lid portion 62.

A dimension W1 of the concave portion 69 in the width direction of the deposition mask 20 is larger than a dimension W2 of the deposition mask 20 in the width direction. In this case, side edges 20f on both sides of the deposition mask 20 in the width direction are arranged on the concave portion 69 in the vicinity of the effective region 22 of the deposition mask 20. As a result, it is possible to effectively deflect the effective region 22 of the deposition mask 20, which has received a downward force, inside the concave portion 69. Therefore, the plastic deformation of the effective region 22 can be effectively prevented.

Figure 31:
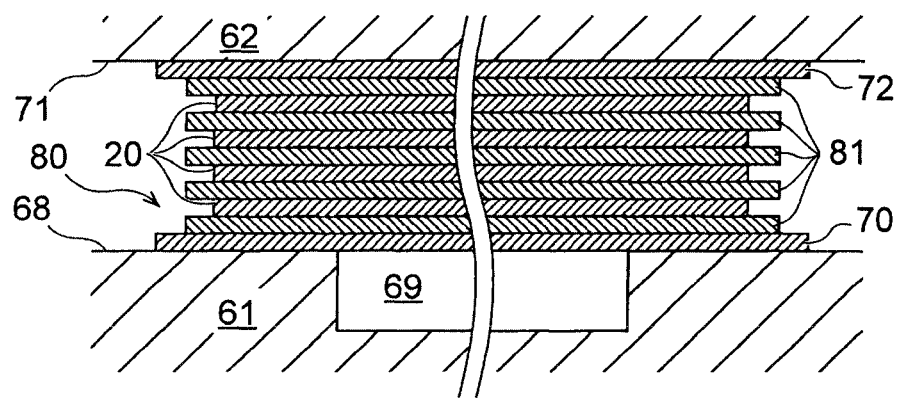
FIG. 31 is an enlarged longitudinal cross-sectional view of a deposition mask stacked body of FIGS. 28 and 29.
Figure 32:
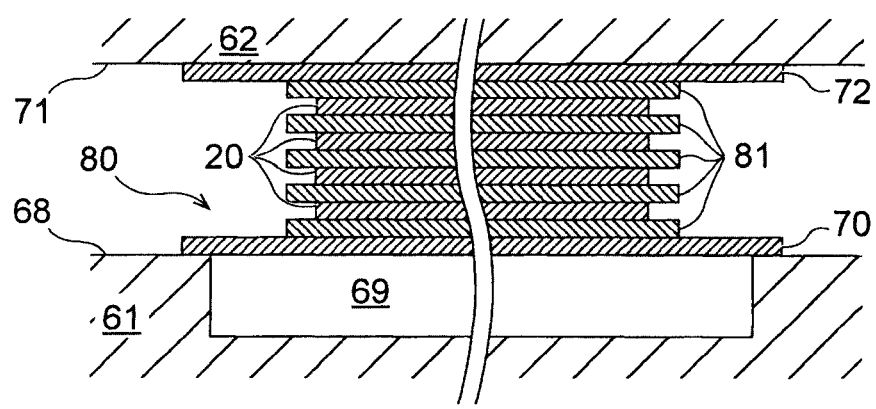
FIG. 32 is an enlarged cross-sectional view of the deposition mask stacked body of FIGS. 28 and 29.

As illustrated in FIGS. 31 to 33, the concave portion 69 is covered with a first flexible film 70 having flexibility. It is preferable that the first flexible film 70 have flexibility enough to absorb a force applied to the deposition mask 20 in the packaged state and an impact applied during transportation. In addition, it is preferable that the first flexible film 70 has strength to such an extent to support the deposition mask stacked body 80 (described later) including the deposition mask 20. An arbitrary film material having an arbitrary thickness can be used for the first flexible film 70 as long as the film has the above characteristics. For example, a polyethylene terephthalate (PET) film having a thickness of 0.15 to 0.20 mm can be suitably used. Since the PET film is relatively hard and hardly forms wrinkles, the plastic deformation of the deposition mask 20 can be effectively prevented.

The first flexible film 70 is preferably antistatic-coated in order to prevent generation of static electricity. More specifically, the first flexible film 70 may be coated with an antistatic agent, and an antistatic layer may be formed on both sides of the first flexible film 70. In this case, it is possible to prevent the first flexible film 70 from being charged, and it is possible to prevent the deposition mask 20 and the interposed sheet 81 from adhering to each other due to electrostatic action during unpacking. An example of the first flexible film 70 is a polyester synthetic paper K2323-188-690 mm manufactured by Toyobo Co., Ltd. sold under the trade name Crisper (registered trademark).

The first flexible film 70 is pasted to the first opposing surface 68 of the receiving portion 61 using an adhesive tape. More specifically, a dimension D4 of the first flexible film 70 in the longitudinal direction of the deposition mask 20 is larger than the dimension D1 of the concave portion 69 in the longitudinal direction as illustrated in FIG. 33. In addition, a dimension W3 of the first flexible film 70 in the width direction of the deposition mask 20 is larger than the dimension W1 of the concave portion 69 in the width direction. It is preferable that a peripheral portion of the first flexible film 70 be continuously pasted to the first opposing surface 68 over the entire circumference. As a result, it is possible to effectively exhibit the flexibility of the first flexible film 70 when a downward force is applied to the deposition mask 20, and the plastic deformation of the deposition mask 20 supported by the first flexible film 70 can be further prevented. An arbitrary material can be used as the adhesive tape as long as the first flexible film 70 can be favorably attached to the receiving portion 61, and examples thereof can include a double-sided tap 665 manufactured by 3M sold under the trade name Scotch (registered trademark). Incidentally, the first flexible film 70 may be pasted to the first opposing surface 68 of the receiving portion 61 with an adhesive applied thereto.

As illustrated in FIGS. 28 to 32, the lid portion 62 has a flat second opposing surface 71 facing the receiving portion 61. In the present embodiment, the second opposing surface 71 is not provided with a concave portion like the first opposing surface 68. That is, the second opposing surface 71 of the lid portion 62 is formed in a flat shape as a whole. As a result, it is possible to secure the strength of the lid portion 62. A portion of the first opposing surface 68 corresponding to the deposition mask stacked body 80 is covered with a second flexible film 72. As the second flexible film 72, a film material having the same thickness as the first flexible film 70 can be suitably used, and the second flexible film 72 can be attached to the second opposing surface 71 of the lid portion 62 similarly to the first flexible film 70. When the lid portion 62 is made of a plastic cardboard sheet, a corrugated shape of a middle core of the cardboard sheet can be prevented from being transferred to the deposition mask 20 by the second flexible film 72. In addition, it is possible to prevent the second opposing surface 71 of the lid portion 62 from being scratched by using the second flexible film 72.

As illustrated in FIGS. 28 and 29, the deposition mask stacked body 80 in which the plurality of deposition masks 20 is stacked is interposed between the first flexible film 70 and the second flexible film 72. That is, the deposition mask stacked body 80 is sandwiched between the receiving portion 61 and the lid portion 62 with each of the first flexible film 70 and the second flexible film 72 interposed therebetween.

As illustrated in FIGS. 31 and 32, the deposition mask stacked body 80 includes the plurality of deposition masks 20 stacked on each other and the plurality of interposed sheets 81 stacked on the first surface 20a and the second surface 20b of the deposition masks 20. In the present embodiment, the plurality of deposition masks 20 and the plurality of interposed sheets 81 are alternately stacked, the first surface 20a of each of the deposition masks 20 is covered with the interposed sheet 81 facing the first surface 20a, and the second surface 20b is covered with the interposed sheet 81 facing the second surface 20b. In addition, the interposed sheet 81 forms the lowermost stage and the uppermost stage of the deposition mask stacked body 80. That is, the interposed sheet 81 is interposed between the deposition mask 20 arranged at the lowermost position and the receiving portion 61, and the interposed sheet 81 is interposed between the deposition mask 20 arranged at the uppermost position and the lid portion 62.

The interposed sheet 81 is configured to prevent the through-holes 25 of one deposition mask 20 and the through-holes 25 of the other deposition mask 20, which are adjacent to each other, from being caught by each other. Therefore, both surfaces (surfaces facing the deposition mask 20 or the flexible films 70, 72) of the interposed sheet 81 are formed in a flat shape, holes, irregularities, and the like are not formed in the interposed sheet 81. The interposed sheet 81 prevents the plastic deformation of the deposition mask 20 when taking out the individual deposition masks 20 from the deposition mask stacked body 80.

The deposition mask 20 and the interposed sheet 81 constituting the deposition mask stacked body 80 are not joined to the receiving portion 61 and are not joined to the lid portion 62.

It is preferable that the deposition masks 20 in the deposition mask stacked body 80 have the same shape and the effective regions 22 of the deposition masks 20 be arranged so as to overlap with each other when viewed along the stacking direction, but it is not limited thereto. In the stacked state, for example, the number or shapes of the effective regions 22 of the deposition masks 20 may be different as long as all the effective regions 22 of the deposition masks 20 can be arranged on the concave portions 69.

An arbitrary material can be used for the interposed sheet 81 as long as the plastic deformation of the deposition mask 20 can be prevented, but it is preferable that a difference between a thermal expansion coefficient of the deposition mask 20 and a thermal expansion coefficient of the interposed sheet 81 is within a predetermined range. In the present embodiment, the difference (absolute value) between the thermal expansion coefficient of the deposition mask 20 and the thermal expansion coefficient of the interposed sheet 81 is 7 ppm/° C. or less. As a result, the difference between the thermal expansion coefficient of the deposition mask 20 and the thermal expansion coefficient of the interposed sheet 81 is reduced.

When the deposition mask 20 is made of an iron alloy containing nickel in an amount of 30% by mass to 54% by mass, the interposed sheet 81 is preferably made of an iron alloy containing nickel in an amount of 30% by mass to 54% by mass. For example, when the deposition mask 20 is made of an invar material containing nickel in an amount of 34% by mass to 38% by mass, the interposed sheet 81 is also preferably made of such invar material. In this case, the difference between the thermal expansion coefficient of the deposition mask 20 and the thermal expansion coefficient of the interposed sheet 81 can be reduced. In the case where the deposition mask 20 is made of an iron alloy containing chromium such as stainless steel with good availability, the interposed sheet 81 is also preferably made of such an iron alloy containing chromium. Even in this case, the difference between the thermal expansion coefficient of the deposition mask 20 and the thermal expansion coefficient of the interposed sheet 81 can be reduced. Further, a material forming the interposed sheet 81 is preferably the same as the material forming the deposition mask 20 in order to further reduce the difference between the thermal expansion coefficient of the deposition mask 20 and the thermal expansion coefficient of the interposed sheet 81. However, the material forming the interposed sheet 81 and the material forming the deposition mask 20 may be different from each other as long as a difference between the thermal expansion coefficients falls within the above-described range. For example, the interposed sheet 81 may be formed of a 42 alloy (an iron alloy containing 42% of nickel). The interposed sheet 81 may be made of a material containing a fiber material such as paper as long as the interposed sheet 81 can be prevented from being caught by the through-hole 25 of the deposition mask 20. For example, the interposed sheet 81 may be made of acrylic-impregnated paper.

A thickness of the interposed sheet 81 is preferably 20 µm to 100 µm. By setting the thickness to 20 µm or larger, an uneven shape due to the through-hole 25 of the deposition mask 20 stacked on one surface of the interposed sheet 81 can be prevented from appearing on the other surface. In addition, it is possible to prevent the interposed sheet 81 from breaking, and it is economical to also reuse the interposed sheet 81. On the other hand, when the thickness is set to 100 µm or smaller, it is possible to reduce the mass of the interposed sheet 81 and suppress an increase in the mass of the deposition mask package 60.

It is preferable that the interposed sheet 81 have such a dimension that a circumferential edge 81a of the interposed sheet 81 can protrude from the deposition mask 20 over the entire circumference when viewed along the stacking direction of the deposition mask 20. In the present embodiment, as illustrated in FIG. 33, a dimension (overall length in the longitudinal direction) D5 of the interposed sheet 81 in the longitudinal direction of the deposition mask 20 is larger than the overall length D3 of the deposition mask 20 in the longitudinal direction, and a dimension W4 of the interposed sheet 81 in the width direction of the deposition mask 20 is larger than the dimension W2 of the deposition mask 20 in the width direction. Thus, the interposed sheet 81 can protrude from the deposition mask 20 over the entire circumference in the deposition mask stacked body 80, and it is possible to prevent the deposition masks 20 adjacent to each other from being brought into direct contact and overlapping with each other. That is, if the overall length D5 of the interposed sheet 81 in the longitudinal direction is smaller than the overall length D3 of the deposition mask 20 in the longitudinal direction, the deposition mask 20 on one side of the interposed sheet 81 and the deposition mask 20 on the other side are brought into direct contact and overlap with each other and there is a possibility that the through-hole 25 is deformed. Similarly, when the dimension W4 of the interposed sheet 81 in the width direction is smaller than the dimension W2 of the deposition mask 20 in the width direction, there is a possibility that the through-hole 25 is deformed in the same manner. However, it is possible to prevent the deposition masks 20 on both the sides of the interposed sheet 81 from being brought into direct contact and overlapping with each other according to the present embodiment since the overall length D5 of the interposed sheet 81 in the longitudinal direction is larger than the overall length D3 of the deposition mask 20 in the longitudinal direction, and the dimension W4 of the interposed sheet 81 in the width direction is larger than the dimension W2 of the deposition mask 20 in the width direction. Therefore, the deformation of the through-hole 25 can be effectively prevented. Incidentally, the dimension W4 of the interposed sheet 81 in the width direction is preferably smaller than the dimension W1 of the concave portion 69 in the width direction.

As illustrated in FIGS. 28 and 29, the receiving portion 61 and the lid portion 62 sandwiching the deposition mask stacked body 80 are sealed by a sealing bag 73. The inside of the sealing bag 73 is evacuated and decompressed. In addition, a desiccant 74 (for example, silica gel) is contained in the sealing bag 73, the desiccant 74 adsorbs moisture in the sealing bag 73 to maintain a dry state of the atmosphere in the sealing bag 73. As a result, the deposition mask 20 is prevented from deteriorating due to moisture. Incidentally, FIG. 27 does not illustrate the sealing bag 73.

As illustrated in FIGS. 28 and 29, the deposition mask package 60 according to the present embodiment may include an impact sensor 75 that detects an impact applied to the deposition mask 20. In this case, the impact applied to the deposition mask 20 during transportation can be confirmed after the transportation. Therefore, when an impact equal to or larger than a predetermined value is applied during transportation, it is possible to estimate a possibility that a defect may occur in the deposition mask 20 so that it is possible to improve the transportation quality of the deposition mask 20. As illustrated in FIGS. 28 and 29, it is preferable that the sealing bag 73 be accommodated in a cardboard box 76, and the impact sensor 75 be mounted in a wooden box 77 packing the cardboard box 76, but it is not limited thereto. As the impact sensor 75, for example, a shock watch label L-30 (green) manufactured by SHOCK-WATCH Inc. can be suitably used.

Next, an operation of the present embodiment having such a configuration will be described. Here, a method of packaging the deposition mask 20 will be described.
(Deposition Mask Packaging Method)

Figure 34:
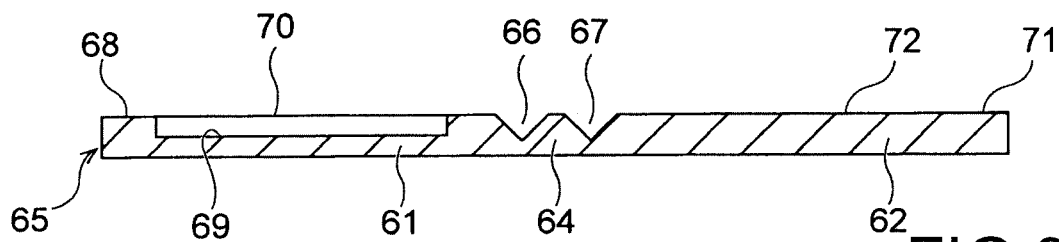
FIG. 34 is a view illustrating an example of a deposition mask packaging method according to a present embodiment.

First, the deposition mask 20 is prepared as described above, and the packaging member 65 constituted by the receiving portion 61 and the lid portion 62 is prepared as illustrated in FIG. 34. At this time, the first flexible film 70 is pasted to the first opposing surface 68 of the receiving portion 61 so as to cover the concave portion 69 of the receiving portion 61, and the second flexible film 72 is pasted to the second opposing surface 71 of the lid portion 62. Incidentally, the first flexible film 70 and the second flexible film 72 may be reused as long as it is regarded that there is no problem for the use such as alteration.

Figure 35:
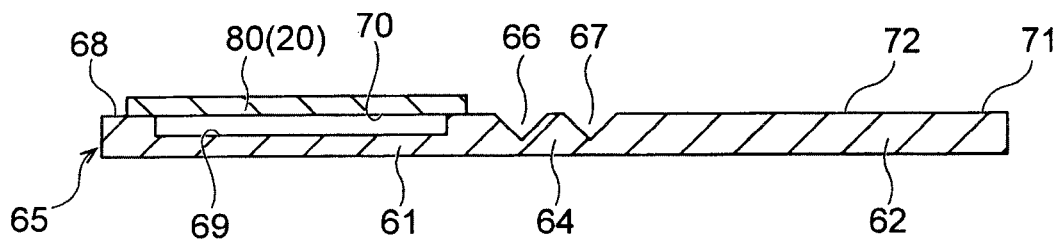
FIG. 35 is a view illustrating an example of the deposition mask packaging method according to the present embodiment.

Next, the deposition mask stacked body 80 placed on the receiving portion 61 of the packaging member 65 is obtained as illustrated in FIG. 35.

In this case, the interposed sheet 81 is first placed on the first flexible film 70. The interposed sheet 81 is arranged at such a position as to overlap with the deposition mask 20 described later.

Subsequently, the deposition mask 20 is placed on the interposed sheet 81. That is, the deposition mask 20 is placed on the first flexible film 70 with the interposed sheet 81 interposed therebetween. In this case, all the effective regions 22 of the deposition masks 20 are arranged on the concave portion 69 with the first flexible film 70 interposed therebetween, and the end 20e of the deposition mask 20 is arranged on the first opposing surface 68.

Next, the interposed sheet 81 is placed on the deposition mask 20. Thus, the interposed sheet 81 is stacked on the first surface 20a and the second surface 20b of the deposition mask 20. The interposed sheet 81 in this case is arranged so as to overlap with the interposed sheet 81 on a bottom surface of the deposition mask 20 when viewed along the stacking direction.

Thereafter, the placement of the deposition mask 20 and the placement of the interposed sheet 81 are repeated in the above-described manner, whereby the plurality of deposition masks 20 and the plurality of interposed sheets 81 are alternately stacked. Further, the interposed sheet 81 is placed on the deposition mask 20 that has been finally stacked, and the lowermost stage and the uppermost stage of the deposition mask stacked body 80 become the interposed sheets 81 (see FIGS. 31 and 32).

Figure 36:
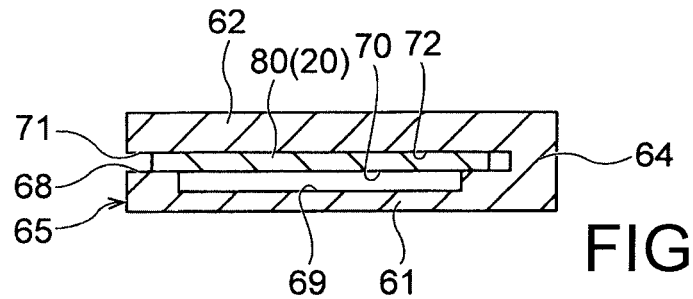
FIG. 36 is a view illustrating an example of the deposition mask packaging method according to the present embodiment.

After obtaining the deposition mask stacked body 80 placed on the receiving portion 61, the lid portion 62 is arranged on the deposition mask stacked body 80 as illustrated in FIG. 36. In this case, the packaging member 65 is folded via the hinge portion 64, and the lid portion 62 is arranged above the deposition mask stacked body 80. As a result, the receiving portion 61 and the lid portion 62 face each other, and the receiving portion 61 and the lid portion 62 are arranged on both the sides of the deposition mask stacked body 80 in the vertical direction.

Figure 37:
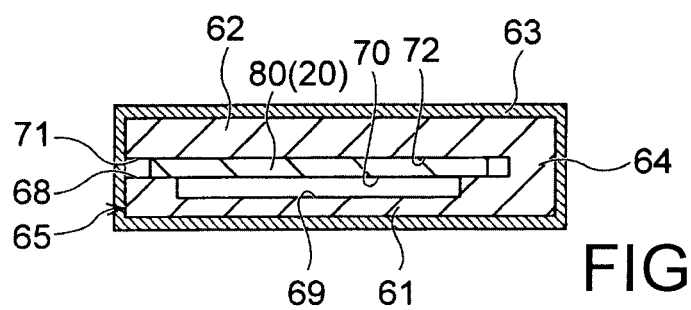
FIG. 37 is a view illustrating an example of the deposition mask packaging method according to the present embodiment.

Next, the deposition mask stacked body 80 is sandwiched between the receiving portion 61 and the lid portion 62 as illustrated in FIG. 37. In this case, the receiving portion 61 and the lid portion 62 are bound by the elastic belt 63. For example, the two elastic belts 63 are attached at different positions in the longitudinal direction of the deposition mask 20 (see FIG. 27). As a result, the receiving portion 61 and the lid portion 62 are bound, and the deposition mask stacked body 80 is held between the receiving portion 61 and the lid portion 62 by the elastic force of the elastic belt 63. More specifically, not the entire deposition mask 20 but the ends 20e on both the sides of the deposition mask 20 in the longitudinal direction are sandwiched between the receiving portion 61 and the lid portion 62. At this time, a gap caused by the thickness of the deposition mask stacked body 80 is formed between the first opposing surface 68 of the receiving portion 61 and the second opposing surface 71 of the lid portion 62.

Figure 39:
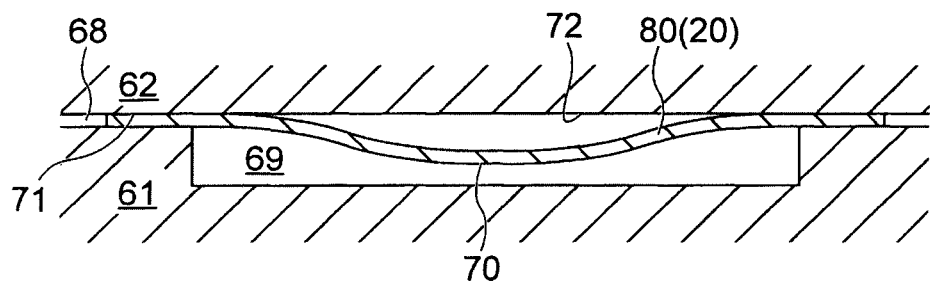
FIG. 39 is a longitudinal cross-sectional view for describing a state where a downward force is applied to the deposition mask stacked body of FIGS. 28 and 29.

The deposition mask stacked body 80 is subjected to a vertical force by the elastic force of the elastic belt 63. In the end 20e of the deposition mask 20, this force is supported by the first opposing surface 68 of the receiving portion 61 and the second opposing surface 71 of the lid portion 62. Meanwhile, since the effective region 22 of the deposition mask 20 is arranged on the concave portion 69, the effective region 22 of the deposition mask 20 is deflected downward due to a downward force received from the second opposing surface 71 of the lid portion 62 as illustrated in FIG. 39. Since the deposition mask 20 is supported by the first flexible film 70 on the concave portion 69, the first flexible film 70 suppresses the deflection of the deposition mask 20, thereby suppressing the deformation of the deposition mask 20. Thus, it is possible to reduce the amount of deformation of the deposition mask 20 and to keep the deformation within an elastic deformation range. Thus, the deposition mask 20 can be restored to its original shape (shape before being packaged) by its own elastic force after unpacking by removing the elastic belt 63.

In addition, since the interposed sheet 81 is interposed between the deposition masks 20, it is avoided that the deposition masks 20 adjacent to each other are brought into direct contact and overlap with each other. Thus, the deposition masks 20 that have received the downward force are prevented from meshing with each other in the effective region 22 including a large number of the through-holes 25, and the deposition mask 20 can be not only smoothly deformed downward but also smoothly restored.

Figure 38:
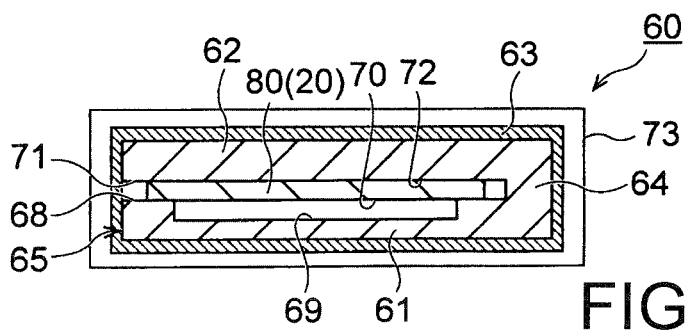
FIG. 38 is a view illustrating an example of the deposition mask packaging method according to the present embodiment.

After the deposition mask stacked body 80 is sandwiched, the packaging member 65 is sealed by the sealing bag 73 as illustrated in FIG. 38. In this case, the packaging member 65 is accommodated in the sealing bag 73 together with the desiccant 74. Subsequently, the inside of the sealing bag 73 is evacuated through an opening. When the pressure inside the sealing bag 73 decreases to a predetermined degree of vacuum, the opening of the sealing bag 73 is sealed.

As illustrated in FIGS. 28 and 29, the packaging member 65 sealed with the sealing bag 73 is accommodated in the cardboard box 76, and the cardboard box 76 is packaged with the wooden box 77. At this time, the impact sensor 75 is mounted in the wooden box 77. In this manner, the deposition mask package 60 according to the present embodiment is obtained.

Next, the case of transporting the deposition mask package 60 obtained in the above-described manner will be described.

An impact may be applied to the deposition mask 20 while the deposition mask package 60 is being transported. For example, when a downward force is applied to the deposition mask 20 by such an impact, the effective region 22 of the deposition mask 20 is deflected downward by the downward force as illustrated in FIG. 39. Since the deposition mask 20 is supported by the first flexible film 70 on the concave portion 69 as described above, the deformation of the deposition mask 20 is suppressed. Therefore, the deformation of the deposition mask 20 can be kept within the elastic deformation range, and the plastic deformation of the deposition mask 20 can be prevented even when receiving the impact during transportation.

In addition, since the interposed sheet 81 is interposed between the deposition masks 20, it is avoided that the deposition masks 20 adjacent to each other are brought into direct contact and overlap with each other. Therefore, even when receiving shocks during transportation, it is possible to prevent the deposition masks 20 from meshing with each other in the effective region 22 and to prevent the deposition masks 20 adjacent to each other from being rubbed. In this manner, the plastic deformation of the deposition mask 20 can be prevented.

There is a case where the temperature of the deposition mask package 60 changes due to changes in the surrounding environment during transportation. In this case, each of the deposition mask 20 and the interposed sheet 81 stretches or contracts. Meanwhile, the difference between the thermal expansion coefficient of the deposition mask 20 and the thermal expansion coefficient of the interposed sheet 81 is set to 7 ppm/° C. or less in the present embodiment. As a result, it is possible to reduce a difference between a dimensional change (stretching or contraction) of the deposition mask 20 and a dimensional change (stretching or contraction) of the interposed sheet 81. Thus, it is possible to prevent wrinkles and scratches from being formed on the deposition mask 20 due to positional deviation between the deposition mask 20 and the interposed sheet 81, and the plastic deformation of the deposition mask 20 can be prevented.

In the case of unpacking the deposition mask package 60 after transportation, it is sufficient to follow a procedure opposite to that of the above-described packaging method of the deposition mask 20. In particular, since the interposed sheet 81 is interposed between the adjacent deposition masks 20, the deposition mask 20 is prevented from meshing with the deposition mask 20 arranged below the former deposition mask 20. Thus, it is possible to take out the individual deposition masks 20 smoothly from the deposition mask stacked body 80. Thus, the plastic deformation of the deposition mask 20 can be prevented, and the handling property of the deposition mask 20 can be improved.

According to the present embodiment, the difference between the thermal expansion coefficient of the deposition mask 20 and the thermal expansion coefficient of the interposed sheet 81 is 7 ppm/° C. or less as described above. As a result, the difference between the thermal expansion coefficient of the deposition mask 20 and the thermal expansion coefficient of the interposed sheet 81 can be reduced. Thus, even when the temperature of the deposition mask package 60 changes due to the changes in the surrounding environment during transportation, it is possible to reduce the difference between the dimensional change of the deposition mask 20 and the dimensional change of the interposed sheet 81. As a result, it is possible to prevent the wrinkles and scratches, which may be caused by the difference in dimensional change, from being formed on the deposition mask 20 and the interposed sheet 81, and to prevent the plastic deformation of the deposition mask 20.

In addition, the effective region 22 of the deposition mask 20 is arranged on the concave portion 69 of the receiving portion 61 with the first flexible film 70 interposed therebetween according to the present embodiment. As a result, the effective region 22 of the deposition mask 20 can be supported by the first flexible film 70. Therefore, it is possible to suppress the deformation of the effective region 22 deflected downward due to the downward force applied to the effective region 22 of the deposition mask 20. Therefore, the deformation of the deposition mask 20 can be kept within the elastic deformation range, and the plastic deformation of the deposition mask 20 can be prevented.

In addition, since the dimension W4 of the interposed sheet 81 in the width direction is smaller than the dimension W1 of the concave portion 69 in the width direction according to the present embodiment, the plastic deformation of the deposition mask 20 can be suppressed.

Figure 40:
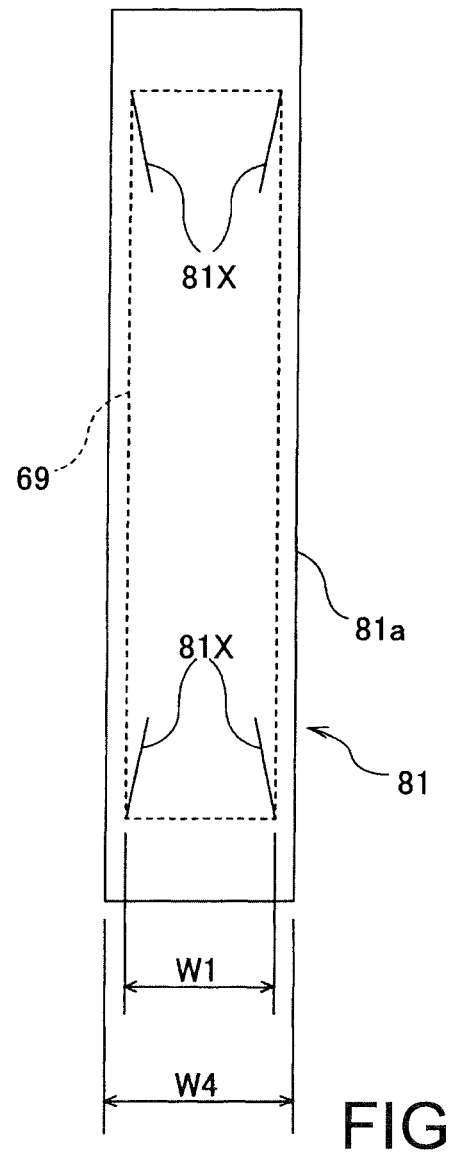
FIG. 40 is a plan view illustrating a recess formed when a dimension of an interposed sheet in a width direction is equal to or larger than a dimension of a concave portion in the width direction.

When the dimension W4 of the interposed sheet 81 in the width direction is equal to or larger than the dimension W1 of the concave portion 69 in the width direction as illustrated in FIG. 40, it is conceivable a case where the deposition mask 20 is plastically deformed due to a shock or the like during transportation. That is, the circumferential edge 81a of the interposed sheet 81 is arranged on the outer side of the concave portion 69 over the entire circumference, and a part of the interposed sheet 81 on the outer side in the width direction of the concave portion 69 is arranged on the first opposing surface 68 of the receiving portion 61 in the example illustrated in FIG. 40. When receiving a downward force in FIG. 39, the part of the interposed sheet 81 above the concave portion 69 is deflected downward together with the first flexible film 70 and the deposition mask 20. There is a case where a recess 81X such as a wrinkle as illustrated in FIG. 40 is formed in the deflected part of the interposed sheet 81. The recess 81X is transferred to the deposition mask 20 in contact with the interposed sheet 81, and the deposition mask 20 is plastically deformed. The recess 81X tends to be more easily formed as the material of the interposed sheet 81 is softer (more specifically, as the proof stress decreases), and more easily formed as the thickness decreases.

Incidentally, when a relatively hard material such as PET is used for the first flexible film 70, it is possible to prevent the formation of the recess in the first flexible film 70, but the recess 81X may be formed in the interposed sheet 81 even when the recess is not formed in the first flexible film 70.

On the other hand, since the dimension W4 of the interposed sheet 81 in the width direction is smaller than the dimension W1 of the concave portion 69 in the width direction as illustrated in FIG. 33 according to the present embodiment, the portion of the interposed sheet 81 on the concave portion 69 is arranged on the concave portion 69 over the entire width direction of the interposed sheet 81. As a result, the portion of the interposed sheet 81 on the concave portion 69 is deflected so as to enter the concave portion 69 over the entire width direction when receiving a downward force. Thus, it is possible to prevent the formation of the recess 81X as illustrated in FIG. 40 and to prevent the plastic deformation of the deposition mask 20.

Although the embodiment of the present invention has been described in detail as above, the deposition mask package and the deposition mask packaging method according to the embodiment of the present invention are not limited to the above-described embodiment, and various modifications can be made in a scope not departing from a gist of the present invention.

Figure 41:
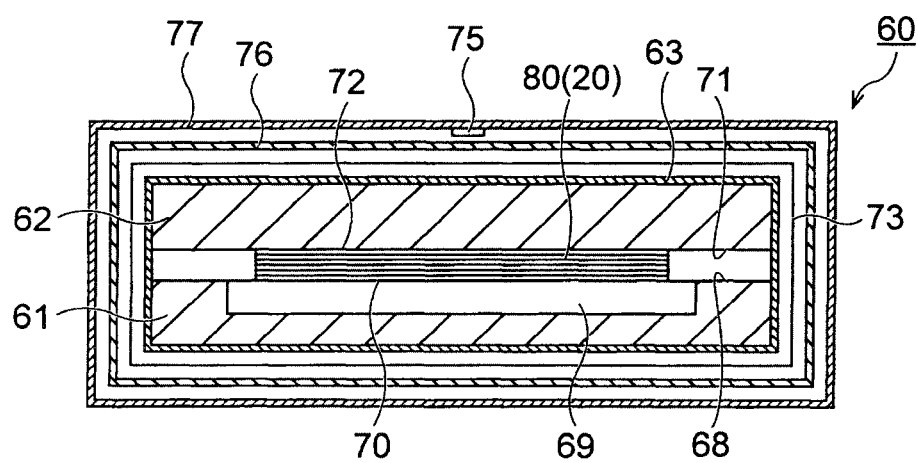
FIG. 41 is a transverse cross-sectional view illustrating a modification of the deposition mask package of FIG. 29.

In the above-described embodiment, the example in which the receiving portion 61 and the lid portion 62 are connected via the hinge portion 64 and integrally formed has been described. However, it is not limited thereto, and the receiving portion 61 and the lid portion 62 may be formed separately as illustrated in FIG. 41. Even in this case, the receiving portion 61 and the lid portion 62 can be bound with the elastic belt 63, and the deposition mask stacked body 80 can be held between the receiving portion 61 and the lid portion 62.

In addition, the example in which the deposition mask stacked body 80 sandwiched between the receiving portion 61 and the lid portion 62 includes the plurality of deposition masks 20 has been described in the above-described embodiment. However, it is not limited thereto, and the deposition mask stacked body 80 may be constituted by one deposition mask 20 and two interposed sheets 81 stacked on the first surface 20a and the second surface 20b of the deposition mask 20. Even in this case, it is possible to prevent other members from being caught by the through-hole 25 of the deposition mask 20, and to prevent the plastic deformation of the deposition mask 20.

In addition, the example in which the interposed sheet 81 and the deposition mask 20 are alternately stacked on the receiving portion 61 of the packaging member 65 to form the deposition mask stacked body 80 has been described in the above-described embodiment. However, it is not limited thereto, and the deposition mask stacked body 80 may be placed on the receiving portion 61 after forming the deposition mask stacked body 80 in advance.

EXAMPLES

A transportation test of the deposition mask package 60 packing the deposition mask 20 was carried out using various interposed sheets 81 and states of the deposition masks 20 after transportation were confirmed.

As the deposition masks 20 used in the transportation test, the deposition masks 20 having various thickness T0 were used as illustrated in FIG. 42. Each of the deposition masks 20 is the deposition mask 20 manufactured by the etching process illustrated in FIGS. 4 to 19. The deposition mask 20 was made of an invar material containing 36% by mass of nickel. In each of the deposition masks 20, the dimension W2 (see FIG. 33) in the width direction was set to 67 mm and the overall length D3 in the longitudinal direction was set to 850 mm.

As illustrated in FIG. 42, sheets made of various materials were used as the interposed sheet 81. More specifically, an invar material containing 36% by mass of nickel was used for the interposed sheet 81 as Example 1, a 42 alloy was used as Example 2, and acrylic-impregnated paper was used as Example 3. On the other hand, stainless steel (SUS 430) was used as Comparative Example 1, high-molecular-weight polyethylene (PE) was used as Comparative Example 2, polyethylene terephthalate (PET) was used as Comparative Example 3, and low-molecular-weight polyethylene was used as Comparative Example 4. A thermal expansion coefficient of each material at 25° C. is set as illustrated in FIG. 42. FIG. 42 illustrates a value obtained by subtracting the thermal expansion coefficient of the deposition mask 20 (the invar material containing 36% by mass of nickel) from the thermal expansion coefficient of the interposed sheet 81. The dimension W4 of each of the interposed sheets 81 in the width direction was 150 mm, the overall length D5 in the longitudinal direction was 980 mm, and the thickness was 75 μm.

Five deposition masks 20 and four interposed sheets 81 were alternately stacked to produce the deposition mask package 60 according to the above embodiment. The deposition mask package 60 was prepared in a work room whose room temperature was controlled at 25° C.

The deposition mask package 60 thus produced was transported to a destination via a land route, an air route, and a land route. The temperature of the destination was −16° C., which is the lowest temperature of the surrounding environment during transportation, and the temperature of the deposition mask 20 was decreased to −16° C. before unpacking. The unpacking of the deposition mask package 60 was performed in a work room whose room temperature was controlled at 25° C. Incidentally, there is a possibility that the highest temperature in the surrounding environment during transportation is higher than 25° C. Even in such a case, it is considered that a temperature difference between the temperature at the time of packaging and the highest air temperature is smaller than a temperature difference between the temperature at the time of packaging and the lowest air temperature. Thus, it was considered that the deformation of the deposition mask 20 may be confirmed by paying attention to the temperature difference between the temperature at the time of packing and the lowest temperature, and the transportation test was carried out.

After unpacking, it was confirmed visually (with naked eyes) whether wavy wrinkles were formed and whether scratches were formed on each of the deposition masks 20. FIG. 42 illustrates results thereof. Here, a mark a indicates that neither a wrinkle nor a scratch were visually observed on all of the five deposition masks 20, and a mark x indicates that at least one of the wrinkle and the scratch was visually confirmed in at least one deposition mask among the five deposition masks 20.

As illustrated in FIG. 42, when the difference between the thermal expansion coefficient of the deposition mask 20 and the thermal expansion coefficient of the interposed sheet 81 is 7 ppm/° C. or less, it has been confirmed that no wrinkle and scratch is formed on the deposition masks 20 of all the 5 thicknesses. That is, the formation of wrinkles and scratches on the deposition mask 20 can be suppressed by setting the difference in thermal expansion coefficient to 7 ppm/° C. or less, and the plastic deformation of the deposition mask 20 can be prevented. If the thickness of the deposition mask 20 is 15 μm or larger, it is considered that the strength of the deposition mask 20 itself can be secured so that the formation of wrinkles on the deposition mask 20 can be further suppressed.

Incidentally, the deposition mask 20 manufactured by the etching process is used in the present embodiment, but it is considered that at least the same results can be obtained even for the deposition mask 20 produced by the plating process. That is, the metal plate 21 produced as a rolled material is used for the deposition mask 20 of the etching process as described above, but a crystal of the deposition mask 20 produced by the plating process is finer than a crystal of the metal plate 21. As a result, the hardness and proof stress of the deposition mask 20 produced by the plating process are larger than those of the metal plate 21. Therefore, even when the deposition mask 20 produced by the plating process is used, it is considered that results equivalent to or greater than those of the present embodiment can be obtained, and the formation of wrinkles and scratches can be further suppressed.

The invention claimed is:

1. A deposition mask packaging method for packaging a deposition mask having an effective region in which a plurality of through-holes is formed, the deposition mask packaging method comprising:
   preparing a receiving portion that has a first opposing surface and a concave portion provided on the first opposing surface and covered with a first flexible film;
   obtaining the deposition mask placed on the receiving portion;
   arranging a lid portion on the deposition mask such that the receiving portion and the lid portion face each other; and
   sandwiching the deposition mask between the receiving portion and the lid portion,
   wherein the effective region of the deposition mask is placed on the concave portion with the first flexible film interposed therebetween in the obtaining of the deposition mask,
   wherein ends on both sides in a first direction of the deposition mask are arranged on the first opposing surface of the receiving portion in the obtaining of the deposition mask,
   wherein an interposed sheet is interposed between the deposition mask and the first flexible film in the step of obtaining the deposition mask, and
   wherein a dimension of the interposed sheet in a second direction, orthogonal to the first direction in a plane direction of the deposition mask, is smaller than a dimension of the concave portion in the second direction.

2. The deposition mask packaging method according to claim 1, wherein the dimension of the concave portion in the second direction orthogonal to the first direction is larger than a dimension of the deposition mask in the second direction.

3. The deposition mask packaging method according to claim 1, wherein the first flexible film is a PET film.

4. The deposition mask packaging method according to claim 1, wherein the first flexible film is antistatic-coated.

5. The deposition mask packaging method according to claim 1, wherein a second flexible film is interposed between the lid portion and the deposition mask in the arranging of the lid portion.

6. The deposition mask packaging method according to claim 1, wherein the receiving portion and the lid portion are connected via a hinge portion in the preparing of the receiving portion.

7. The deposition mask packaging method according to claim 1, further comprising sealing the receiving portion and the lid portion with a sealing bag after the sandwiching of the deposition mask.

8. The deposition mask packaging method according to claim 7, further accommodating the sealing bag in a cardboard box after sealing of the receiving portion and the lid portion, packaging the cardboard box with a wooden box, and mounting an impact sensor to the wooden box, the impact sensor detecting an impact applied to the deposition mask.

* * * * *